(12) United States Patent
Yamazaki et al.

(10) Patent No.: US 7,741,132 B2
(45) Date of Patent: Jun. 22, 2010

(54) DISPLAY PANEL, DISPLAY PANEL INSPECTION METHOD, AND DISPLAY PANEL MANUFACTURING METHOD

(75) Inventors: Shunpei Yamazaki, Setagaya (JP); Jun Koyama, Atsugi (JP); Yasuyuki Arai, Atsugi (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 633 days.

(21) Appl. No.: 11/518,229

(22) Filed: Sep. 11, 2006

(65) Prior Publication Data

US 2007/0004062 A1     Jan. 4, 2007

Related U.S. Application Data

(62) Division of application No. 09/873,447, filed on Jun. 5, 2001, now Pat. No. 7,189,585.

(30) Foreign Application Priority Data

Jun. 5, 2000    (JP)    ............... 2000-168203
Jun. 5, 2000    (JP)    ............... 2000-168214

(51) Int. Cl.
*H01L 21/66*    (2006.01)
*H01L 21/02*    (2006.01)

(52) U.S. Cl. ........................ 438/17; 438/155
(58) Field of Classification Search .................. None
See application file for complete search history.

(56) References Cited

U.S. PATENT DOCUMENTS

| | | |
|---|---|---|
| 4,940,934 A | 7/1990 | Kawaguchi et al. |
| 5,179,345 A | 1/1993 | Jenkins et al. |
| 5,184,082 A | 2/1993 | Nelson |
| 5,428,300 A | 6/1995 | Takahashi et al. |
| 5,539,326 A | 7/1996 | Takahashi et al. |
| 5,550,484 A | 8/1996 | Mitsumori et al. |
| 5,576,730 A | 11/1996 | Shimada et al. |
| 5,693,959 A | 12/1997 | Inoue et al. |
| 5,760,855 A | 6/1998 | Nakase et al. |
| 5,990,629 A | 11/1999 | Yamada et al. |
| 6,111,424 A | 8/2000 | Bosacchi |

(Continued)

FOREIGN PATENT DOCUMENTS

JP    10-312882    11/1998

(Continued)

*Primary Examiner*—Zandra Smith
*Assistant Examiner*—Pamela E Perkins
(74) *Attorney, Agent, or Firm*—Eric J. Robinson; Robinson Intellectual Property Law Office, P.C.

(57) ABSTRACT

A method of inspecting a display panel, which is capable of distinguishing between whether an EL panel is a good product or a defective product before sealing of the display panel, is provided. In a first method of inspection, a conductive film is patterned to forming pixel electrodes after measuring the electric current flowing in the conductive film and detecting defective pixels in accordance with the measured values. In a second method of inspection, all of the pixel electrodes are connected by an inspection conductive film, a value of electric current flowing in the inspection conductive film is measured, and the inspection conductive film is removed after detecting defective pixels in accordance with the measured values.

42 Claims, 21 Drawing Sheets

U.S. PATENT DOCUMENTS

| | | |
|---|---|---|
| 6,265,889 B1 | 7/2001 | Tomita et al. |
| 6,274,887 B1 | 8/2001 | Yamazaki et al. |
| 6,472,256 B1 | 10/2002 | Zhang et al. |
| 6,501,227 B1 | 12/2002 | Koyama |
| 6,518,962 B2 | 2/2003 | Kimura et al. |
| 6,528,950 B2 | 3/2003 | Kimura |
| 6,632,711 B2 | 10/2003 | Sugano et al. |
| 6,729,922 B2 | 5/2004 | Hiroki |
| 6,762,735 B2 | 7/2004 | Koyama |
| 2001/0001050 A1 | 5/2001 | Miyashita et al. |
| 2004/0239598 A1* | 12/2004 | Koyama ............ 345/76 |

FOREIGN PATENT DOCUMENTS

| | | |
|---|---|---|
| JP | 11-031587 | 2/1999 |

* cited by examiner

| (1, 1) | (2, 1) | (3, 1) | (4, 1) | | (x-1, 1) | (x, 1) |
|---|---|---|---|---|---|---|
| (1, 2) | (2, 2) | (3, 2) | (4, 2) | | (x-1, 2) | (x, 2) |
| (1, 3) | (2, 3) | (3, 3) | (4, 3) | | (x-1, 3) | (x, 3) |
| (1, 4) | (2, 4) | (3, 4) | (4, 4) | | (x-1, 4) | (x, 4) |
| ⋮ | ⋮ | ⋮ | ⋮ | | ⋮ | ⋮ |
| (1, y-1) | (2, y-1) | (3, y-1) | (4, y-1) | | (x-1, y-1) | (x, y-1) |
| (1, y) | (2, y) | (3, y) | (4, y) | | (x-1, y) | (x, y) |

Fig.7

| (1, 1) | (2, 1) | (3, 1) | (4, 1) | | (x-1, 1) | (x, 1) |
|---|---|---|---|---|---|---|
| (1, 2) | (2, 2) | (3, 2) | (4, 2) | | (x-1, 2) | (x, 2) |
| (1, 3) | (2, 3) | (3, 3) | (4, 3) | | (x-1, 3) | (x, 3) |
| (1, 4) | (2, 4) | (3, 4) | (4, 4) | | (x-1, 4) | (x, 4) |
| | | | | | | |
| (1, y-1) | (2, y-1) | (3, y-1) | (4, y-1) | | (x-1, y-1) | (x, y-1) |
| (1, y) | (2, y) | (3, y) | (4, y) | | (x-1, y) | (x, y) |

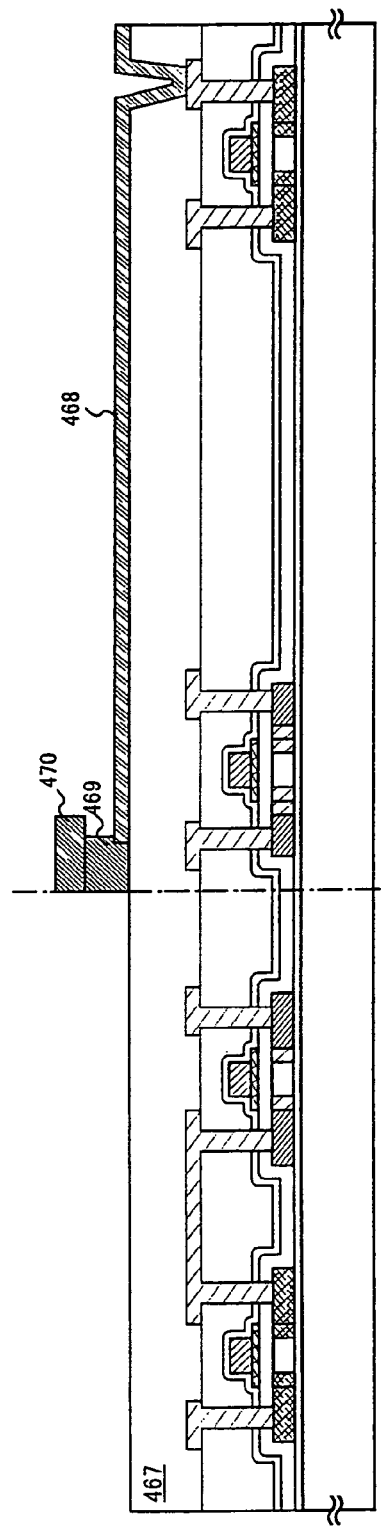
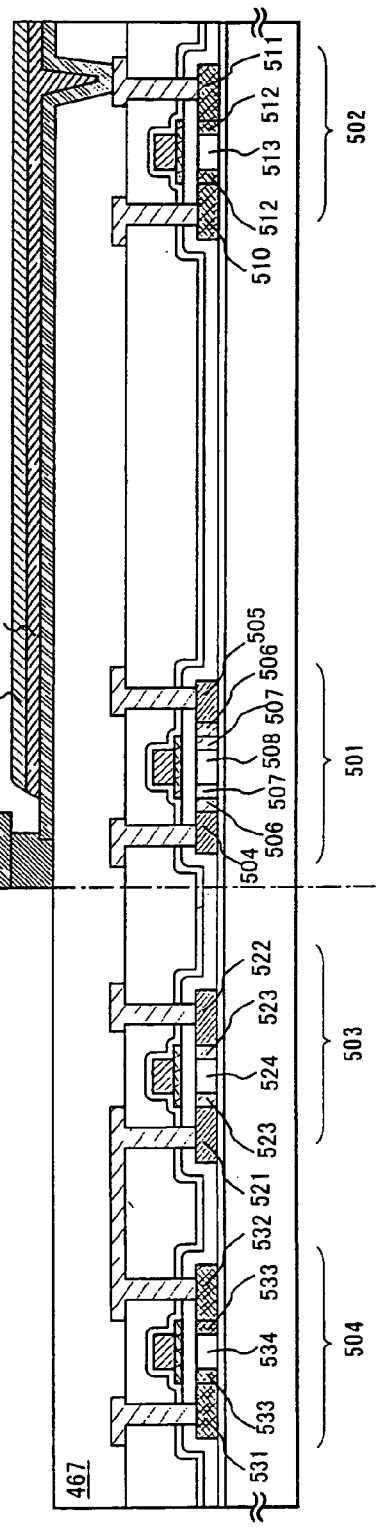
Fig.13A
Fig.13B

DISPLAY PANEL, DISPLAY PANEL INSPECTION METHOD, AND DISPLAY PANEL MANUFACTURING METHOD

BACKGROUND OF THE INVENTION

1. Field of the Invention

The present invention relates to a method of inspecting whether or not a pixel portion is able to operate normally before forming of an EL (electro luminescence) element, in an electronic display in which the EL element is formed on a substrate, a manufacturing method of the electronic display including the method of inspecting, a display panel formed with the method of inspecting, and an electronic device comprising the display panel. In particular, the present invention relates to a method of inspecting (inspection method) whether or not the pixel portion is able to operate normally before forming an EL element in an EL display using a semiconductor element (element using a semiconductor thin film), a manufacturing method of the EL display including the method of inspecting, an EL panel formed with the method of inspecting, and an electronic device comprising the EL panel.

2. Description of the Related Art

Techniques of forming a TFT on a substrate have greatly advanced in recent years, and development of applications to active matrix type electronic display devices is proceeding. In particular, TFTs using a polysilicon film have a higher electric field effect mobility (also referred to as mobility) than TFTs using a conventional amorphous silicon film, and therefore it is capable of high speed operation. It therefore becomes possible to perform control of a pixel, conventionally preformed by a driver circuit provided outside the substrate, by a driver circuit formed on the same substrate as the pixel.

The above type of active matrix electronic display device obtains many advantages, such as lowered manufacturing cost, smaller electronic display size, increased yield, and decreased throughput, by building various circuits and elements on the same substrate.

In addition, research on active matrix type EL display devices comprising EL elements as self-light emitting elements has become spirited. The EL display device is also referred to as organic EL display (OELD) or an organic light emitting diode (OLED).

The EL display device is a self-light emitting type, which differs from a liquid crystal display device. The EL element has a structure in which an EL layer is sandwiched between a pair of electrodes, and the EL layer has normally a lamination structure. A lamination structure of "a hole transporting layer, a light emitting layer, and an electron transporting layer" proposed by Tang, et al., of Eastman Kodak Co. can be given as a typical structure. This structure has extremely high light emitting efficiency, and nearly all EL display devices for which research and development is proceeding employ this structure.

Further, additional structures such as "a hole injecting layer, a hole transporting layer, a light emitting layer, and an electron transporting layer" formed in order on a pixel electrode; or "a hole injecting layer, a hole transporting layer, a light emitting layer, an electron transporting layer, and an electron injecting layer" formed in order on a pixel electrode may also be used. An element such as a fluorescing pigment may also be doped into the EL layer.

Note that all layers formed between the anode and the cathode are defined as EL layers in this specification. Specifically, layers such as light emitting layers, hole injecting layers, hole transporting layers, electron transporting layers, and electron injecting layers are included in EL layers.

In the above structure, a direct current electric field is generated in the EL layer by application of a predetermined voltage to the EL layer from a pair of electrodes, carrier recombination thus occurs in the light emitting layer, and light is emitted. There is electro luminescence in the EL layer in returning to a base state from a singlet excitation state (fluorescence), and in returning to a base state from a triplet excitation state (phosphorescence), and either type or both types of light emission, may be used.

Note that an element formed by an anode, an EL layer, and a cathode is referred to as an EL element within this specification. Furthermore, the light emission of the EL element is referred to as driving the EL element.

Deterioration of EL layers is promoted by such factors as heat, light, moisture, and oxygen, and therefore EL elements are generally formed after the formation of wirings and TFTs in a pixel portion during the manufacture of an active matrix EL display.

After formation of the EL elements, the substrate on which the EL elements are formed (EL panel) and a cover material are attached and sealed (packaged) by using a sealing material and the like so that the EL elements are not exposed to the atmosphere.

A connector (such as FPC or TAB) is attached after increasing the airtightness by the packaging process or the like in order to connect the elements or terminals leading from circuits, formed on the substrate, to external signal terminals, and the active matrix EL display is complete.

The voltage applied to an EL layer from a pair of electrodes of an EL element in an active matrix EL display is controlled by a TFT formed in each pixel. Therefore, if a TFT in a pixel portion does not function as a switching element, or a wiring is cut or shorted, then a predetermined voltage cannot be applied to the EL layer of the EL element. The pixel cannot display the desired graduation sequence in that case.

If the defect as above develops in the wirings or TFTs for controlling light emission of the EL element, then it is difficult to verify the existence of the defect before the EL display is complete and actual display is performed. Therefore, in order to distinguish an EL panel which will not become a product from a good product, it is necessary to form the EL elements, perform packaging, attach the connectors, and complete the EL display. The processes of forming the EL elements, performing packaging, and connecting the connectors are wasted in this case, and, therefore time and cost for production cannot be reduced. Further, even for EL panels formed by using a substrate which is taken from a multi-faced substrate, the processes of the packaging and the attachment of the connector become wasted, and time and cost similarly cannot be reduced.

With active matrix liquid crystal displays, which have become mass produced ahead of active matrix EL displays, before completing the liquid crystal display by injecting liquid crystals between a panel comprising the pixel portion (liquid crystal panel) and a substrate comprising an opposing electrode, an electric charge is accumulated in a capacitor in each pixel after formation of wirings and TFTs in a pixel portion. Whether or not any defects have developed in the pixel portion is verified by measuring the amount of the electric charge for each pixel.

However, in the case of active matrix EL displays, two or more TFTs are generally formed in each pixel. There are also cases in which one of the electrodes (pixel electrode) of the EL element is connected to a capacitor through a TFT. In this case, even if the amount of electric charge accumulated in the capacitor is measured, it becomes difficult to verify whether or not there are any defects in the wirings and TFTs connected between the capacitor and the pixel electrode.

The establishment of a method of inspection for determining whether or not there are defects in wirings and TFTs in the pixel portion, in other words, whether or not a predetermined voltage can be applied to the pixel electrode of the EL element of each pixel, before completing the EL display, is needed toward mass production of active matrix EL displays.

SUMMARY OF THE INVENTION

In a first method of inspecting an EL panel disclosed in the present invention, a film with a conductive property (conductive film) to become a pixel electrode of an EL element is formed on the entire pixel portion after forming wirings and TFT in the pixel portion. The conductive film must be formed over the wirings or the TFTs, sandwiching an interlayer insulating film in between, so that the wirings and TFTs in the pixel portion do not develop shorts. The conductive film is formed so as to be connected to a source region or a drain region of at least one TFT of each pixel.

An electric potential required for displaying an actual image is then imparted to the wirings of respective pixels. Note that, in this specification, a state in which an electric potential required for displaying an actual image is imparted to a wiring in a pixel, namely to a wiring to which an electric potential for controlling the driving of the EL element provided in the pixel is imparted, is referred to as a state in which the pixel is selected.

The electric current flowing in the conductive film is then measured when each pixel is selected. By determining whether or not the measured electric current values fall within a predetermined range, it is possible to judge whether or not any defects have developed in the wirings and TFTs of each pixel.

For example, if the electric current flowing in the conductive film is outside of a predetermined range when a certain pixel is selected, then it can be determined that a defect, such as the TFT of the pixel is not functioning as a switching element, a wiring is cut, or there is a short, has developed. Conversely, if the electric current flowing in the conductive film falls within the predetermined range when a certain pixel is selected, then it can be seen that the TFTs of the pixel, and the wirings, are functioning normally.

Note that the range of electric current values within which the TFTs and the wirings can be considered as functioning normally can be suitably set by the operator. Further, as a result of inspection, it can be determined that an EL panel is a defective product when the number of pixels in which defects have developed (defective pixels) is equal to or greater than n. Note that the number of defective pixels n for indicating a defective product can be suitably set by the operator.

The conductive film can be formed into pixel electrodes by patterning after inspection is complete with the first inspection method. It is therefore not necessary to increase the number of process steps in order to perform inspection.

In addition, the first inspection method of the present invention can also be applied to a liquid crystal display. For a liquid crystal display, a conductive film with a conductive property to become a pixel electrode, is formed in an entire pixel portion of the liquid crystal panel after forming wirings and TFTs. In this case, it is necessary to form the conductive film on the wirings and TFT, sandwiching an interlayer insulating film, so that the wirings and TFTs in the pixel portion do not all develop shorts due to the conductive film.

Note that a panel comprising a pixel portion is referred to as a display panel in this specification, and EL panels and liquid crystal panels are both contained within the display panel category.

All of the pixels are then selected in order by applying an electric potential required for performing actual display to the wirings of the pixels. Note that, in the case of a liquid crystal panel, the wirings of the pixels denote wirings to which an electric potential is applied in order to drive liquid crystals provided between the pixel electrode and an opposing electrode in each pixel.

The value of the electric current flowing in the pixel electrode or in the conductive film to become the pixel electrode is measured when each pixel is selected. Whether or not the wirings and TFTs of each pixel have developed defects can be judged by determining whether or not the measured electric current values fall within a fixed range.

Liquid crystals are injected between the liquid crystal panel and an opposing substrate comprising the opposing electrode after inspection is finished, and the liquid crystal display is complete. In accordance with the above structure, it becomes possible to investigate whether or not any defects have developed in the pixel portion before completing the liquid crystal display. A process of injecting liquid crystals and a process for attaching a connector after injection can therefore be omitted, and both time and cost can be reduced. Further, the opposing substrate comprising the opposing electrode does not become wasted.

In the second method of inspecting an EL panel disclosed in the present invention, the pixel electrodes of all the pixels to be inspected are electrically connected by a film with a conductive property and used for inspection (inspection conductive film) which is formed after the wirings, the TFTs and the pixel electrodes of the EL elements are formed in the pixel portion.

An electric potential required for displaying an actual image is then imparted to the wirings of respective pixels.

The electric current flowing in the inspection conductive film is then measured when each pixel is selected. By determining whether or not the measured electric current values fall within a predetermined range, it is possible to judge whether or not any defects have developed in the wirings and TFTs of each pixel.

For example, if the electric current flowing in the inspection conductive film is outside of a predetermined range when a certain pixel is selected, then it can be determined that a defect, such as the TFT of the pixel is not functioning as a switching element, a wiring is cut, or there is a short, has developed. Conversely, if the electric current flowing in the inspection conductive film falls within the predetermined range when a certain pixel is selected, then it can be seen that the TFTs of the pixel, and the wirings, are functioning normally.

Note that the range of electric current values within which the TFTs and the wirings can be considered as functioning normally can be suitably set by the operator. Further, as a result of inspection, it can be determined that an EL panel is a defective product when the number of pixels in which defects have developed (defective pixels) is equal to or greater than n. Note that the number of defective pixels n for indicating a defective product can be suitably set by the operator.

The inspection conductive film is removed after the inspection is complete.

It becomes possible to differentiate good EL panels from defective EL panels before completing the EL panel into an EL display, in accordance with the inspection method of the present invention. It therefore becomes unnecessary to complete the defective EL panels, which will not become actual products, into EL displays. The processes of forming EL elements, packaging, and attaching a connector can thus be omitted for the defective EL panels, and time and cost can be reduced. Further, the packaging process and the connector attachment process can also be omitted in a case in which the EL panels are formed using a multifaceted substrate, and time and cost can similarly be reduced.

Note that the inspection method of the present invention is not only applicable to EL panels in which a plurality of TFTs for controlling light emitted from the EL element are formed in each pixel. It is also possible to distinguish between good products and defective products using the inspection method of the present invention, even if an EL panel has, in each pixel, only one TFT formed for controlling light emitted from the EL element.

In addition, the second inspection method of the present invention can also be applied to a liquid crystal display. For a liquid crystal display, all of the pixel electrodes of the pixels to be inspected are electrically connected by an inspection conductive film with a conductive property, after forming wirings, pixel electrodes, and TFTs in the pixel portion of the liquid crystal panel.

All of the pixels are then selected in order by applying an electric potential required for performing actual display to the wirings of the pixels. Note that, in the case of a liquid crystal panel, the wirings of the pixels denote wirings to which an electric potential is applied in order to drive liquid crystals provided between the pixel electrode and an opposing electrode in each pixel.

The value of the electric current flowing in the pixel electrode or in the inspection conductive film is measured when each pixel is selected. Whether or not the wirings and TFTs of each pixel have developed defects can be judged by determining whether or not the measured electric current values fall within a fixed range.

Liquid crystals are injected between the liquid crystal panel and an opposing substrate comprising the opposing electrode after inspection is finished, and the liquid crystal display is complete. In accordance with the above structure, it becomes possible to investigate whether or not any defects have developed in the pixel portion before completing the liquid crystal display. A process of injecting liquid crystals and a process for attaching a connector after injection can therefore be omitted, and both time and cost can be reduced. Further, the opposing substrate comprising the opposing electrode does not become wasted.

BRIEF DESCRIPTION OF THE DRAWINGS

In the accompanying drawings:

FIG. 7 is an arrangement pattern of a pixel portion;

FIGS. 13A and 13B are diagrams showing the method of manufacturing an EL panel applying the inspection method of the present invention;

DETAILED DESCRIPTION OF THE PREFERRED EMBODIMENTS

Embodiment Mode

Figure 1:
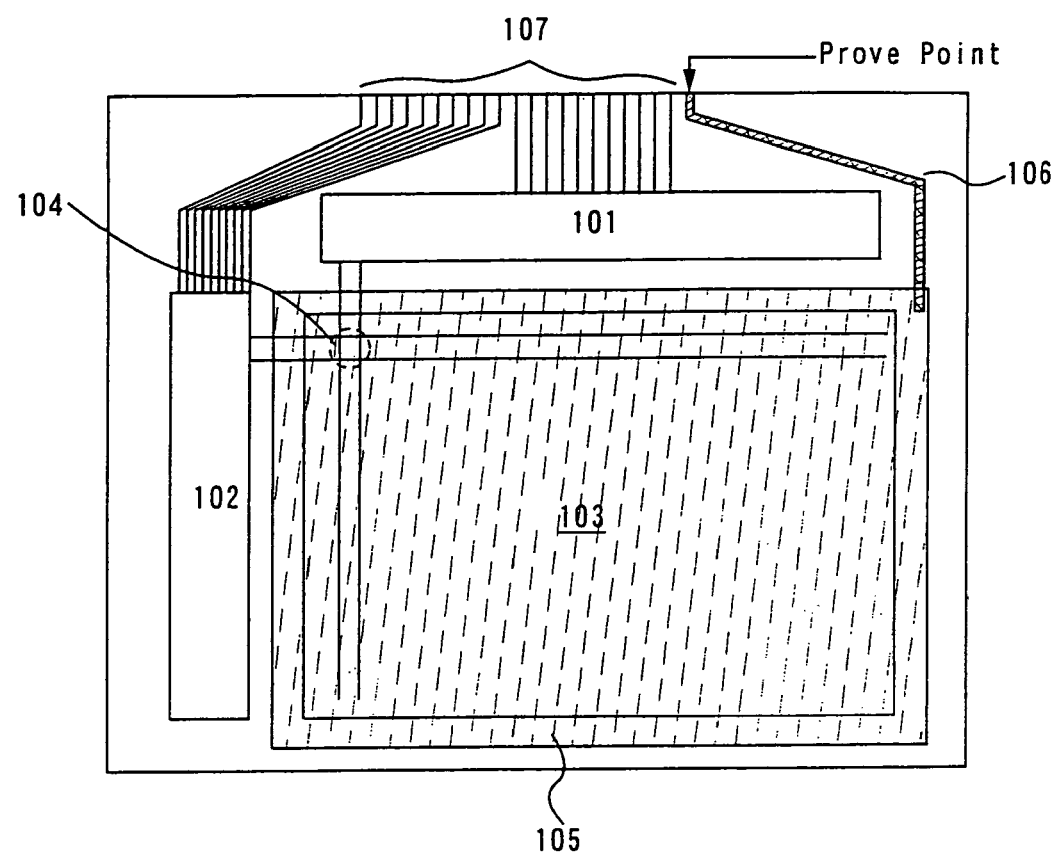
FIG. 1 is a top surface diagram of an EL panel applying a inspection method of the present invention.

The first method of inspecting an EL panel according to the present invention is explained in detail using FIG. 1. FIG. 1 is a top surface diagram of an EL panel during inspection, and a source signal line driver circuit 101, a gate signal line driver circuit 102, and a pixel portion 103 are formed as shown in the diagram. A region containing one of source signal lines, one of gate signal lines, and one of electric power source supply lines in the pixel portion 103 denotes a pixel 104. A conductive film 105 is formed on the pixel portion 103.

Note that the conductive film 105 is a film for forming pixel electrodes. It is necessary that the conductive film 105 is formed without forming a short circuit with the source signal lines, gate signal lines, or electric power source supply lines formed in the pixel portion 103, and the conductive film 105 is formed on an interlayer insulating film (not shown in the figure) formed on the pixel portion 103 in the embodiment mode.

External connection wirings 107 are wirings for inputting signals from outside of the EL panel to the source signal line driver circuit 101 or to the gate signal line driver circuit 102, through a connector.

The conductive film 105 is connected to an electric current meter outside the EL panel through a measurement wiring 106. The measurement wiring 106 may be formed using a material with a conductive property. The electric current flowing in the conductive film 105 is measured at a prove point.

Figure 2:
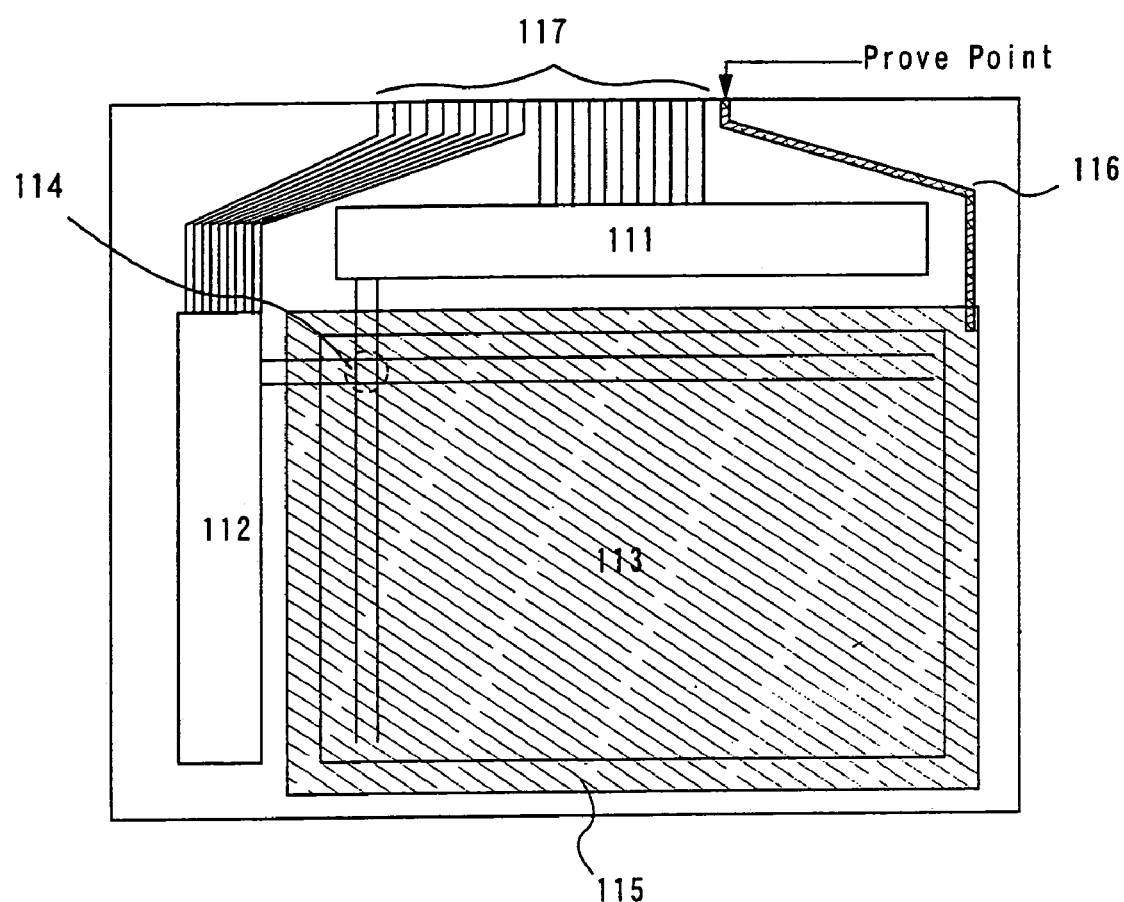
FIG. 2 is a top surface diagram of an EL panel applying the inspection method of the present invention.

The second method of inspecting an EL panel according to the present invention is explained next in detail using FIG. 2. FIG. 2 is a top surface diagram of an EL panel during inspection, and a source signal line driver circuit 111, a gate signal line driver circuit 112, and a pixel portion 113 are formed as shown in the diagram. A region containing one of source signal lines, one of gate signal lines, and one of electric power source supply lines in the pixel portion 103 denotes a pixel 114. A inspection conductive film 115 is formed on the pixel portion 113.

Note that the inspection conductive film 115 is a film for electrically connecting the pixel electrodes of all the pixels 114. It is necessary that the inspection conductive film 115 is formed not to form a short circuit with the source signal lines, gate signal lines, or electric power source supply lines formed in the pixel portion 113.

It is very important that the material used as the inspection conductive film 115 has a conductive property, and that only the inspection conductive film can be removed after inspection. A synthetic resin with a conductive property, or a synthetic resin mixed with a conductive material can be used as the material used for the inspection conductive film. Examples of the former include polyacethylene and polyvinyl carbazole. For the latter, it is possible to use isotropic conductive materials in which a conductive powder or a foil such as Au, Ag, Cu, Ni, carbon black, and graphite, or a conductive fiber such as a metallic fiber, and carbon fiber is mixed in large quantity into a synthetic resin such as polyimide, acrylic, polyimide amide, BCB (benzocyclobutene), polyethylene, polystyrene, polyvinyl chloride, and polyamide. Further, a metallic salt may also be added to the synthetic resin with a conductive property.

Additionally, a metal may also be used as the inspection conductive film, provided that it is a material which is capable of being removed by wet etching without corroding the pixel electrodes.

If crystallized ITO is used as the pixel electrodes, then it is also possible to use amorphous ITO as the inspection conductive film. Crystallized ITO is not affected by wet etching, and therefore only the amorphous ITO used as the inspection conductive film is removed by wet etching after the inspection is complete.

External connection wirings 117 are wirings in order to input signals from outside the EL panel, through a connector, to the source signal line driver circuit 111 or to the gate signal line driver circuit 112.

The inspection conductive film 115 is connected to an electric current meter outside the EL panel through a measurement wiring 116. The measurement wiring 116 may be formed using a material with a conductive property. The electric current flowing in the inspection conductive film 115 is measured at the prove point.

Figure 3:
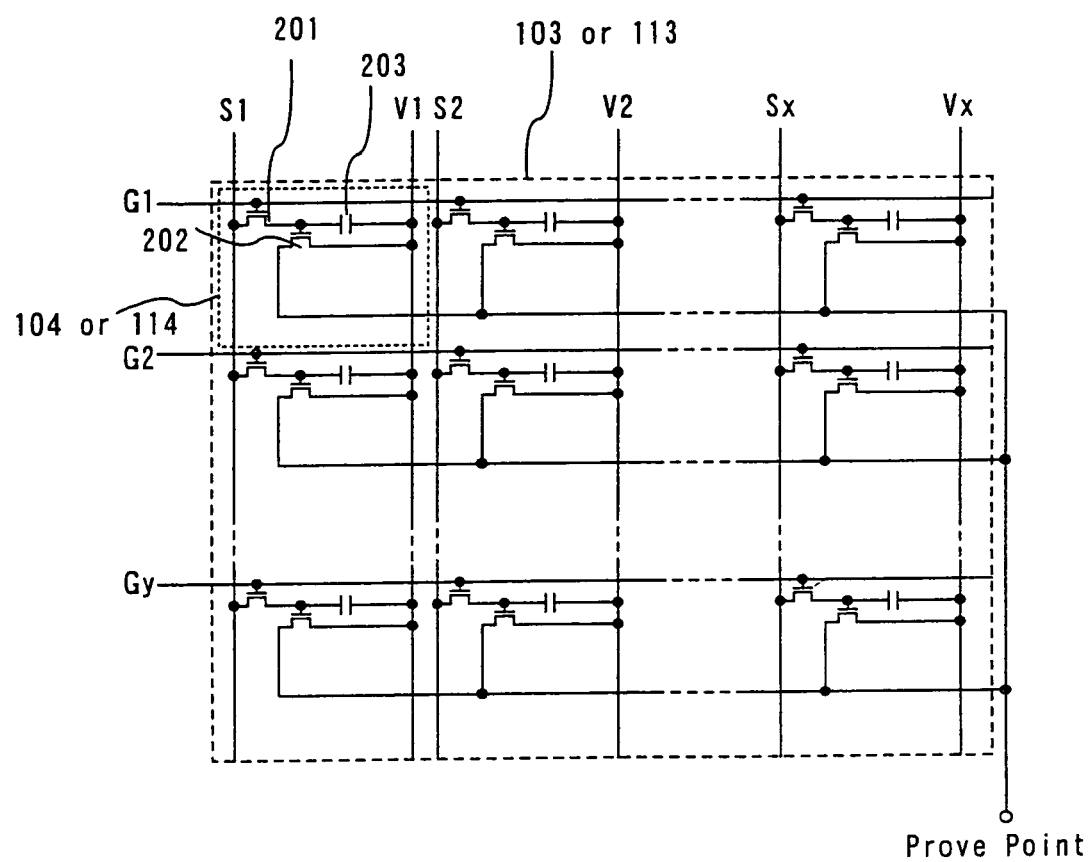
FIG. 3 is a circuit diagram of a pixel portion of an EL panel applying the inspection method of the present invention.

A circuit diagram of the pixel portion 103 shown in FIG. 1, is shown in FIG. 3. Note that the pixel portion 113 has the same circuit diagram as the pixel portion 103, and therefore FIG. 3 can be referenced. The region which has any one of gate signal lines G1 to Gy, any one of source signal line S1 to Sx, and any one of electric power source supply lines V1 to Vx, is the pixel 104 (or the pixel 114). A plurality of the pixels 104 are arranged in a matrix shape in the pixel portion 103 (or the pixel portion 113).

The gate signal lines G1 to Gy to which a selection signal is input from the gate signal line 102 (or 112) are connected to gate electrodes of switching TFTs 201 of respective pixels. Further, one of a source region and a drain region of the switching TFT 201 of each pixel, is connected to one of the source signal lines S1 to Sx, and the other is connected to a gate electrode of EL driver TFT 202 of each pixel and to capacitor 203 of each pixel. An analog video signal is input from the source signal line driver circuit 101 (or 111) to the source signal lines S1 to Sx.

The capacitors 203 are formed in order to store a gate voltage of the EL driver TFTs 202 (electric potential difference between the gate electrode and the source region) when the switching TFTs 201 are off. Note that, although a structure in which the capacitors 203 are formed is shown in the embodiment mode, the present invention is not limited to this structure, and a structure in which the capacitors 203 are not formed may also be used.

The source regions of the EL driver TFTs 202 of the respective pixels are connected to the electric power source supply lines V1 to Vx. The electric potential of the electric power source supply lines V1 to Vx is referred to as an electric power source potential in this specification. The electric power source potential is imparted by an electric power source formed by ICs and the like attached externally to the EL panel. Further, the electric power source supply lines V1 to Vx are connected to the capacitors 203 of each pixel. Drain regions of the EL driver TFTs 202 of the respective pixels 104 (or 114) are all electrically connected by the conductive film 105 (the inspection conductive film 115 for the pixels shown in FIG. 2). The electric current flowing in the conductive film 105 (the inspection conductive film 115 for the pixels shown in FIG. 2) is measured at the prove point.

The procedures for measuring the electric current at the prove point in the first and the second inspection methods are explained below using FIGS. 4A and 4B.

Figures 4A, 4B:
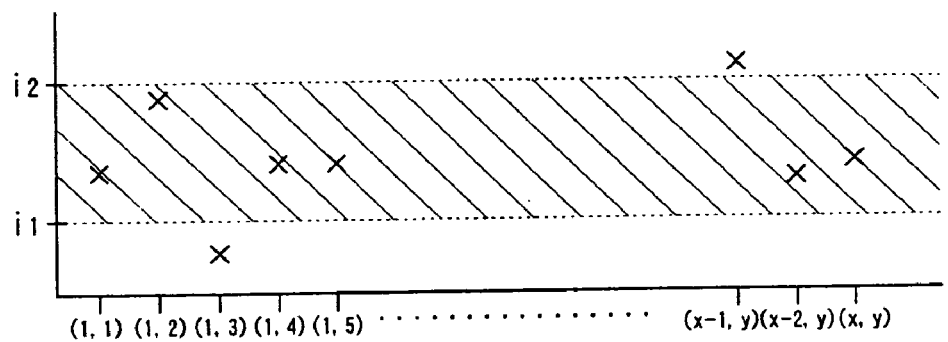
FIGS. 4A and 4B are a pixel portion arrangement pattern and a graph showing a measurement judgment standard, respectively.

The arrangement of the pixels 104 (or the pixels 114) in the pixel portion 103 (or the pixel portion 113) shown in FIG. 3 are shown simply in FIG. 4A. The left numeral in the parentheses shows the number of the source signal line of the pixel, and the right numeral shows the number of the gate signal line of the pixel. For example, (x, y) denotes a pixel with a source signal line Sx and a gate signal line Gy.

First, the electric power source potential of the electric power source supply lines V1 to Vx is maintained at the same electric potential as that for performing actual display. Specifically, in performing display with a completed EL display, the electric potential difference between a pixel electrode and an opposing electrode is maintained in order that the EL elements emit light when the electric power source potential is applied to the pixel electrode of the EL elements. Note that the opposing electrode denotes the electrode which is not the pixel electrode from among the two electrodes of the EL elements.

The selection signal is then input from the gate signal line driver circuit 102 (or 112) to the gate signal line G1. The selection signal has an electric potential which ideally switches on all of the switching TFTs 201 which have the gate electrodes connected to the gate signal lines G1.

Note that, in this specification, when a predetermined electric potential is applied to one of a source region and a drain region of a TFT, the state of the TFT is defined as being on if a desired potential can be applied to the other. Conversely, when the predetermined electric potential is applied to one of the source region and the drain region of the TFT, the state of the TFT is defined as being off if the desired potential can not be applied to the other.

An inspection video signal is then input from the source signal line gate signal line driver circuit 101 (or 111) to the source signal line S1. The electric potential of the inspection video signal is set to be same as the electric potential of a video signal input to the source signal lines S1 to Sx to perform the brightest display when the EL display is actually performing display. Further, in the case of an EL display which performs display using a digital video signal, the electric potential of the inspection video signal may be set in order that the EL elements emit light at the same brightness as during actual display.

The same electric potential as that to a pixel actually performing display is imparted to the signal lines which are necessary for a pixel (1,1) to display an image (the source signal line S1, the gate signal line G1, and the electric power source wirings V1 in the case of FIG. 3). The same electric potential as that to the pixel performing actual display is then applied to the signal lines which participates in display of the pixel (1,1), and the pixel (1,1) is selected.

In the case of FIG. 3, specifically, a state in which the electric power source potential of the electric power source supply line V1 is maintained at the same electric potential as that in actually performing image display, the selection signal is input to the gate signal line G1, and the inspection video signal is input to the source signal line S1, is referred to as the pixel (1,1) being selected.

If the pixel (1,1) is selected, the electric power source potential of the electric power source supply line V1 is imparted to the conductive film 105 or to the inspection conductive film 115, and the value of the electric current is measured at the prove point.

All of the pixels 104 are then selected in order, and the value of the electric current is measured at the prove point.

If any one of the TFTs of each pixel (the switching TFT 201 and the EL driver TFT 202 in the case of FIG. 3) is not functioning normally, or if disconnection or short has developed in a source signal line S (one of the source signal lines S1 to Sx), a gate signal line G (one of the gate signal lines G1 to Gy), an electric power supply line V (one of the electric power lines V1 to Vx), or a wiring connecting TFTs, then the value of the electric current measured at the prove point will not be the ideal value.

A criterion for judging whether or not the measured value of the electric current at the prove point is the ideal value can be suitably set by the operator. For example, if the measured value of the electric current is contained within a range from i1 to i2, then the measured value can be determined to be the ideal value, as the pixel (1,1) and a pixel (1,2) shown in FIG. 4B. The values of i1 and i2 can be suitably set by the operator. Note that the "x" symbol in FIG. 4B denotes the measured value of the electric current at the prove point when the pixel is selected.

It is determined that no defects of the wirings or the TFTs have developed in the pixel, and that a predetermined voltage can be applied to the pixel electrode of the. EL element formed in the pixel, provided that the measured value is the ideal value.

Further, if the measured values of the electric current are outside of the range from i1 to i2, as a pixel (1,3) and a pixel (x−1, y) shown in FIG. 4B, it can be judged that the measured value is not the ideal value. It is determined that a defect therefore has developed in the wirings or in the TFTs of the pixel, and a predetermined voltage can not be applied to the pixel electrode of the EL element formed in the pixel.

It is judged whether or not an EL panel which has pixels with developed defects (defective pixels) is used as an EL display. An EL panel in which even one defective pixel exists in the pixel portion 103 or in the pixel portion 113 may be found to be a defective product and unusable as an EL display, or EL panels in which the number of defective pixels is greater than the number determined by the operator may be found to be defective and unusable as EL displays.

Pixel electrodes (not shown in the figure) are formed by patterning the conductive film 105 after inspection is complete if an EL panel is judged to be a good product in accordance with the first method of inspection in a case of one EL panel formed on one substrate. EL layers and opposing electrodes are then formed and laminated in order, for completing EL elements 204. Further, processes after the inspection can be omitted for EL panels judged to be defective products. (See FIG. 5.) In a case of forming a plurality of EL panels from one substrate, the conductive film 105 is patterned for all of the EL panels to form pixel electrodes (not shown in the figure). EL layers and opposing electrodes are then formed and laminated in order, for completing the EL elements 204. A plurality of EL panels are separated by sectioning the substrate, and the EL displays are completed with the EL panels judged to be good products by sealing with a cover material and attaching a connector, while all processes after sectioning can be omitted for the EL panels judged to be defective products.

The pixel electrodes can be formed by patterning the conductive film after the inspection is complete in accordance with the first inspection process. It is therefore not necessary to increase the number of processes for inspection.

In the second method of inspection, the inspection conductive film 115 is removed by a solvent for EL panels judged to be good products after inspection is completed when one EL panel is formed from one substrate. The solvent used is one which can dissolve only the synthetic resin used as the inspection conductive film 115.

EL layers and opposing electrodes are then formed and laminated in order on the pixel electrodes, and the EL elements 204 are complete. Further, the processes after inspection can be omitted for EL panels judged to be defective products. (See FIG. 5.)

If a plurality of EL panels is formed from one substrate, then the inspection conductive film 115 is removed from all of the EL panels after inspection is complete. The EL layers and the opposing electrodes are next formed and laminated in order on the pixel electrodes to complete the EL elements 204. The plurality of EL panels are then separated by sectioning the substrate, and the EL panels determined to be good products are completed as EL displays by sealing with a cover material and attaching a connector, while the processes after sectioning can be omitted for the EL panels determined to be defective products.

The electric potential of the opposing electrodes (opposing electric potential) of the EL elements 204 is applied by an electric power source formed by ICs or the like which is external to the EL panel.

After forming the EL elements 204, a protective film (not shown in the figures) may be formed so as to cover the EL elements, completing the EL panel. Note that it is not always necessary to form the protective film, and in that case, the EL panel is considered to be completed when the EL elements 204 are formed.

In accordance with the above stated inspection methods of the present invention, it becomes possible to distinguish between good and defective EL panels without completing the EL panels into EL displays. It therefore becomes unnecessary to complete defective EL panels, which will not actually become finished products, into EL displays. The processes for forming the EL elements, packaging (sealing), and attaching a connector can consequently be omitted, and the time and cost can be reduced. Furthermore, the processes for packaging and for attaching a connector can also be omitted in cases in which the EL panels are formed using a multi-faceted substrate, and the time and cost can similarly be reduced.

Note that the inspection method of the present invention is not applicable only to an EL panel in which a plurality of TFTs for controlling light emitted from the EL element are formed in each pixel. It is also possible to distinguish between good products and defective products by using the inspection method of the present invention, even if an EL panel has only one TFT formed for controlling the amount of light emitted from the EL elements in each pixel. Further, it is possible to distinguish between good products and defective products by using the inspection method of the present invention in cases of EL panels in which two or more TFTs are formed in each pixel in order to control the light emitted from the EL element.

Figure 5:
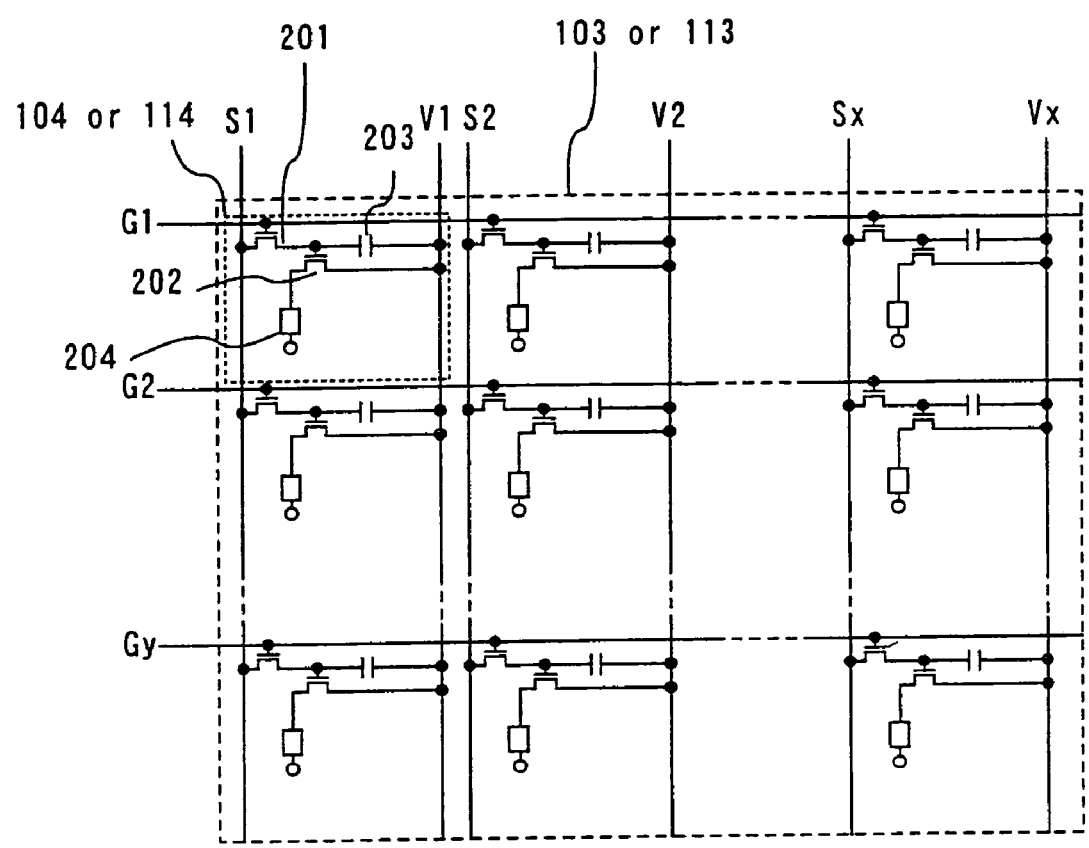
FIG. 5 is a circuit diagram of a pixel portion of an EL panel after applying the inspection method of the present invention.

Note that the switching TFTs 201 and the EL driver TFTs 202 in the EL panels shown in FIG. 3 and FIG. 5 may be n-channel TFTs and may be p-channel TFTs. If an anode of the EL element 204 is connected to the drain region of the EL driver TFT 202, then the anode of the EL element 204 becomes the pixel electrode and a cathode becomes the opposing electrode, and it is preferable that a p-channel TFT be used as the EL driver TFT. Conversely, if the cathode of the EL element 204 is connected to the drain region of the EL driver TFT 202, then the anode of the EL element 204 becomes the opposing electrode, and the cathode becomes the pixel electrode, and it is preferable that an n-channel TFT be used as the EL driver TFT 202.

Further, the switching TFTs 201 and the EL driver TFTs 202 are not limited to a single gate structure, and may have a multi-gate structure such as a double gate structure and a triple gate structure.

EMBODIMENTS

Embodiments of the present invention are explained below.

Embodiment 1

An example of applying the inspection method of the present invention to an EL panel comprising a pixel portion with a different structure from the EL panel shown in the embodiment mode is explained in embodiment 1.

Figure 6:
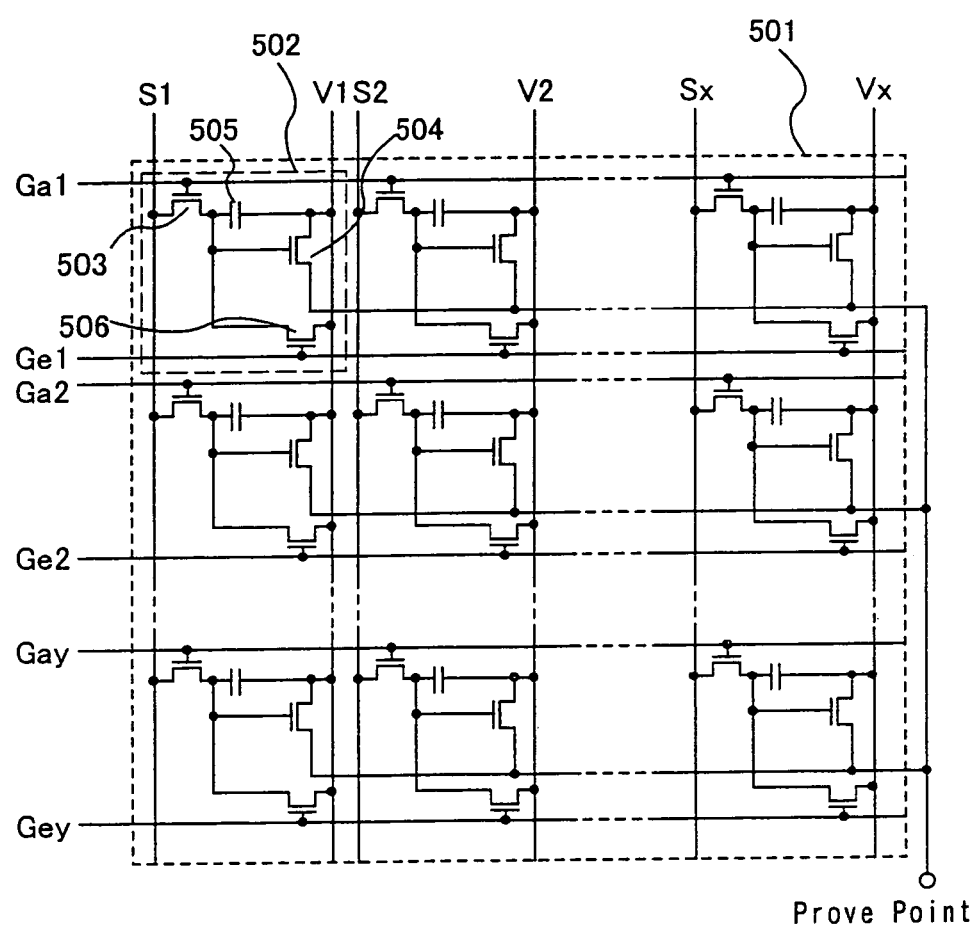
FIG. 6 is a circuit diagram of a pixel portion of an EL panel applying the inspection method of the present invention.

A circuit diagram of a pixel portion 501 of an EL panel used in embodiment 1 is shown in FIG. 6. In embodiment 1, a region which has any one of first gate signal lines Ga1 to Gay, any one of second gate signal lines Ge1 to Gey, any one of the source signal lines S1 to Sx, and any one of the electric power source supply lines V1 to Vx, is a pixel 502. A plurality of pixels 502 are arranged in a matrix shape in the pixel portion 501.

Any one of the first gate signal lines Ga1 to Gay to which a first selection signal is input from a first gate signal line driver circuit is connected to a gate electrode of a first switching TFT 503 of each pixel 502. Further, one of a source region and a drain region of the first switching TFT 503 of each pixel is connected to any one of the source signal lines S1 to Sx for inputting an analog signal, and the other is connected to a gate electrode of an EL driver TFT 504 of each pixel and to a capacitor 505 of each pixel.

The capacitor 505 is formed in order to store a gate voltage of the EL driver TFT 504 (electric potential difference between the gate electrode and the source region) when the switching TFT 503 is off. Note that, although a structure in which the capacitor 505 is formed is shown in the embodiment 1, the present invention is not limited to this structure, and a structure in which the capacitor 505 is not formed may also be used.

The source region of the EL driver TFT 504 is connected to one of the electric power source supply lines V1 to Vx. Drain regions of the EL driver TFTs 504 are all electrically connected by a conductive film (not shown in the figures) to become the pixel electrodes of EL elements in the first method of inspection. One of the electric power source supply lines V1 to Vx is connected to the capacitor 505. In the second inspection method, the drain region of the EL driver TFT 504 is connected to the pixel electrode of the EL element, and the pixel electrodes of all the pixels are electrically connected by an inspection conductive film (not shown in the figures). One of the electric power source supply lines V1 to Vx is connected to the capacitor 505.

Further, one of a source region and a drain region of a second switching TFT 506 is connected to the source region or the drain region of the first switching TFT 503, and the other is connected to one of the electric power source supply lines V1 to Vx. A gate electrode of the second switching TFT 506 is connected to one of the second gate signal line Ge1 to Gey to which a second selection signal is input from a second gate signal line driver circuit.

The electric power source potential of the electric power source supply lines V1 to Vx is imparted by an electric power source formed by ICs and the like which is external to the EL panel. Further, the electric power source supply lines V1 to Vx are connected to the capacitors 505 of respective pixels.

The electric current flowing in the conductive film or in the inspection conductive film is measured at the prove point. The procedures for measuring the electric current at the prove point are explained below using FIG. 7.

The arrangement of the pixels 502 in the pixel portion 501, shown in FIG. 6, is shown simply in FIG. 7. The left numeral in the parentheses shows the number of the source signal line of the pixel, and the right numeral shows the number of the first and second gate signal lines of the pixel. For example, (x, y) denotes a pixel comprising a source signal line Sx, a first gate signal line Gay, and a second gate signal line Gey.

It is necessary to perform measurements two times for each pixel of EL panels with the pixel portion 501 shown in FIG. 6, when a first selection signal is input to the first gate signal line, and when a second selection signal is input to the second gate signal line.

First, the electric power source potential of the electric power source supply lines V1 to Vx is maintained at the same electric potential as that for performing actual display. Specifically, in performing display with a completed EL display, the electric potential difference between a pixel electrode and an opposing electrode is maintained in order that the EL elements emit light when the electric power source potential is applied to the pixel electrode of the EL elements.

The first selection signal is then input from the first gate signal line driver circuit to the first gate signal line Ga1. The first selection signal has an electric potential which ideally switches on all of the first switching TFTs 503 which have the gate electrodes are connected to the gate signal lines Ga1.

An inspection video signal is then input from the source signal line gate signal line driver circuit to the source signal line S1. The electric potential of the inspection video signal is set to be same as the electric potential of a video signal input to the source signal lines S1 to Sx to perform the brightest display when the EL display is actually performing display. Further, in the case of an EL display which performs display using a digital video signal, the electric potential of the inspection video signal may be set in order that the EL elements emit light at the same brightness as during actual display.

The same electric potential as that actually applied to signal lines of the pixel performing display is imparted to the signal lines which participate in display for a pixel (1,1) (the source signal line S1, the first gate signal line Ga1, and the electric power source supply line V1 in the case of FIG. 6), and the pixel is selected. In the case of FIG. 6, specifically, a state in which the electric power source potential of the electric power source supply line V1 is maintained at the same electric potential as that in actually performing image display, the first selection signal is input to the first gate signal line Ga1, and the inspection video signal is input to the source signal line S1, is referred to as the pixel (1,1) being selected.

When the pixel (1,1) is selected, the electric power source potential of the electric power source supply line V1 is imparted to the conductive film or to the inspection conductive film, and the value of the electric current is measured at the prove point.

All of the pixels 502 are then selected in order, and the value of the electric current is measured at the prove point.

Next, the pixel (1,1) is then selected again. With the electric power source potential of the electric power source supply lines V1 to Vx maintained to be same as that in performing actual display, the second selection signal is input to the second gate signal line Ge1 from the second gate signal line driver circuit.

The second selection signal has an electric potential which ideally switches on all of the second switching TFTs 506 which have the gate electrodes connected to the second gate signal lines Ge1.

Incase of the pixel portion 501 shown in FIG. 6, all of the EL driver TFT 504 of the pixels (1,1), (2,1), ..., (x,1) are turn off when the second switching TFT 506 become on, and ideally no electric current flows in the conductive film or the inspection conductive film.

An electric potential at which the pixel (1,1) does not perform display is thus imparted to the signal lines which participate in display of the pixel (1,1) (the second gate signal line Ge1 and the electric power source supply line V1 in the case of FIG. 6) after the pixel (1,1) is selected. This state is referred to as the pixel being in an unselected state in this specification. In the case of FIG. 6, specifically, a state in which the electric power source potential of the electric power source supply line V1 is maintained at the same electric potential as that in actually performing image display, and the second selection signal is input to the second gate signal line Ge1, is referred to as the pixel (1,1) being unselected.

The pixel (1,1) is placed in an unselected state, and the value of the electric current is measured at the prove point.

All of the pixels 502 are them similarly placed in an unselected state, and the values of the electric current are measured in the prove point.

If any one of the TFTs (the first switching TFT 503, the second switching TFT 506, and the EL driver TFT 202 in the case of FIG. 6) of each pixel is not functioning normally, or if a source signal line S (one of the source signal lines S1 to Sx), a first gate signal line Ga (one of the first gate signal lines Ga1 to Gay), a second gate signal line Ge (one of the second gate signal lines Ge1 to Gey), an electric power supply line V (one of the electric power supply lines V1 to Vx), or a wiring connecting TFTs is cut or has a short developed, then the value of the electric current measured at the prove point will not be the ideal value.

A criterion for judging whether or not the measured value of the electric current at the prove point is the ideal value when the pixel is in the unselected state, can be suitably set by the operator. For example, if the measured value of the electric current is contained within a range from i3 to i4, then the measured value can be determined to be the ideal value. The values i3 and i4 can be suitably set by the operator.

It is determined that there no defects of the wirings or the TFTs have developed in the pixel and that a predetermined voltage can be applied to the pixel electrode of the EL element formed in the pixel, provided that the measured value is the ideal value.

Further, if the measured values of the electric current are outside of the range from i3 to i4, it can be judged that the measured value is not the ideal value. It is determined that a defect therefore has developed in the wirings or in the TFTs of the pixel, and a predetermined voltage cannot be applied to the pixel electrode of the EL element formed in the pixel.

It is judged whether or not an EL panel which has pixels with developed defects (defective pixels) is used as an EL display. An EL panel in which even one defective pixel exists in the pixel portion 501 may be found to be unusable as an EL display, or EL panels in which the number of defective pixels is greater than the number determined by the operator may be found to be unusable as EL displays.

Pixel electrodes (not shown in the figure) are formed by patterning the conductive film after inspection is complete if an EL panel is judged to be a good product in accordance with the first method of inspection in a case of one EL panel formed on one substrate. EL layers and opposing electrodes are then formed and laminated in order, for completing EL elements 507. Further, processes after the inspection can be omitted for EL panels judged to be defective products. (See FIG. 5.) In a case of forming a plurality of EL panels from one substrate, the conductive film is patterned for all of the EL panels to form pixel electrodes (not shown in the figure). EL layers and opposing electrodes are then formed and laminated in order, for completing the EL elements 507. A plurality of EL panels are separated by sectioning the substrate, and the EL displays are completed with the EL panels judged to be good products by sealing with a cover material and attaching a connector, while all processes after sectioning can be omitted for the EL panels judged to be defective products.

The pixel electrodes can be formed by patterning the conductive film after the inspection is complete in accordance with the first inspection process. It is therefore not necessary to increase the number of processes for inspection.

In the second method of inspection, the inspection conductive film 115 is removed for EL panels judged to be good products after inspection is completed when one EL panel is formed from one substrate. EL layers and opposing electrodes are then formed and laminated in order on the pixel electrodes, and the EL elements 507 are complete. Further, the processes after inspection can be omitted for EL panels judged to be defective products. (See FIG. 8.)

If a plurality of EL panels is formed from one substrate, then the inspection conductive film is removed from all of the EL panels after inspection is complete. The EL layers and the opposing electrodes are next formed and laminated in order on the pixel electrodes to complete the EL elements 507. The plurality of EL panels are then separated by sectioning the substrate, and the EL panels determined to be good products are completed as EL displays by sealing with a cover material and attaching a connector, while the processes after sectioning can be omitted for the EL panels determined to be defective products.

The electric potential of the opposing electrodes (opposing electric potential) of the EL elements 507 is applied by an electric power source formed by ICs or the like which is external to the EL panel.

After forming the EL elements 507, a protective film (not shown in the figures) may formed so as to cover the EL elements 507, completing the EL panel. Note that it is not always necessary to form the protective film, and in that case, the EL panel is considered to be completed when the EL elements are formed.

In accordance with the above stated inspection methods of the present invention, it becomes possible to distinguish between good and defective EL panels without completing the EL panels into EL displays. It therefore becomes unnecessary to complete defective EL panels, which will not actually become finished products, into EL displays. The processes for forming the EL elements, packaging (sealing), and attaching a connector can consequently be omitted, and the time and cost can be reduced. Furthermore, the processes for packaging and for attaching a connector can also be omitted in cases in which the EL panels are formed using a multi-faceted substrate, and the time and cost can similarly be reduced.

Note that the inspection method of the present invention is not applicable only to an EL panel in which a plurality of TFTs for controlling light emitted from the EL element are formed in each pixel. It is also possible to distinguish between good products and defective products by using the inspection method of the present invention, even if an EL panel has only one TFT formed for controlling the amount of light emitted from the EL elements in each pixel. Further, it is possible to distinguish between good products and defective products by using the inspection method of the present invention in cases of EL panels in which two or more TFTs are formed in each pixel in order to control the light emitted from the EL element.

Figure 8:
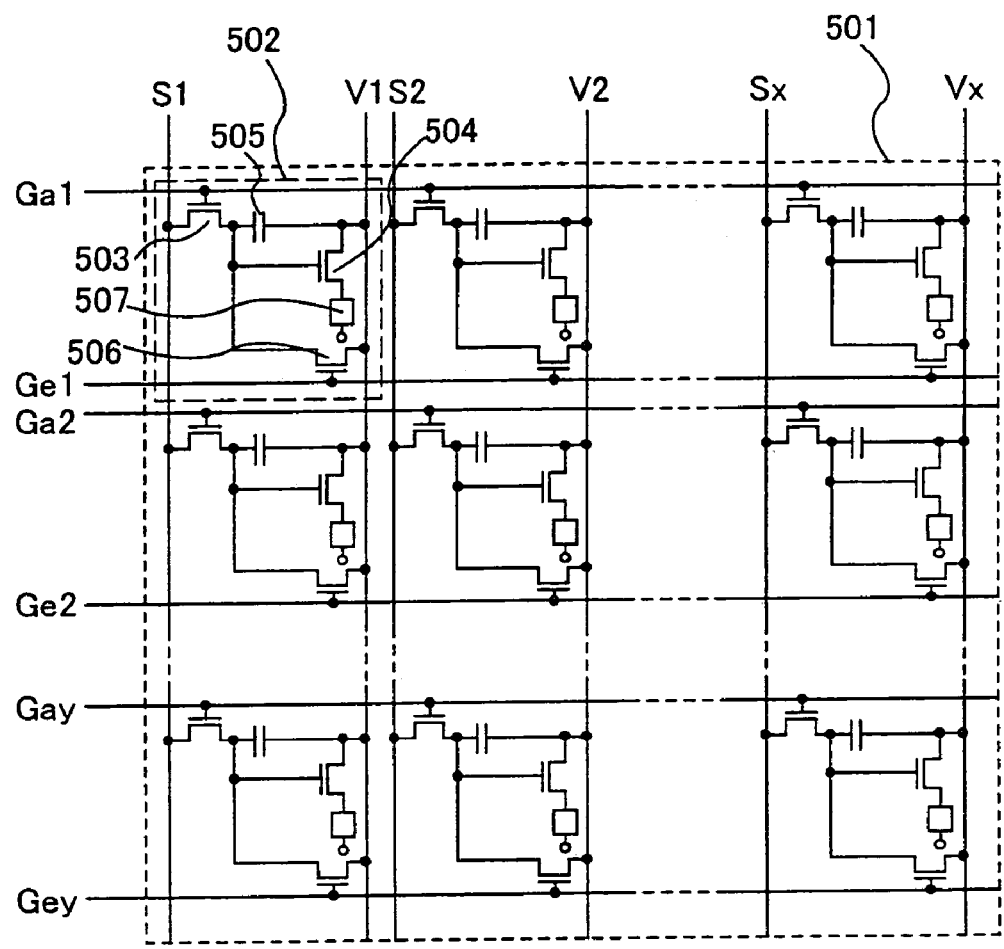
FIG. 8 is a circuit diagram of a pixel portion of an EL panel after applying the inspection method of the present invention.

Note that the first switching TFTs 503, the second switching TFTs 506, and the EL driver TFTs 504 in the EL panels shown in FIGS. 6 and 8 may be n-channel TFTs and may be p-channel TFTs. If an anode of the EL element 507 is connected to the drain region of the EL driver TFT 504, then the anode of the EL element 507 becomes the pixel electrode and a cathode becomes the opposing electrode, and it is preferable that the EL driver TFT 504 be formed using a p-channel TFT. Conversely, if the cathode of the EL element 507 is connected to the drain region of the EL driver TFT 504, the anode of the EL element 507 becomes the opposing electrode, and the cathode becomes the pixel electrode, and it is preferable that the EL driver TFT 504 be formed using an n-channel TFT.

Further, the first switching TFTs 503, the second switching TFTs 506, and the EL driver TFTs 504 are not limited to a single gate structure, and may have a multi-gate structure such as a double gate structure and a triple gate structure.

Embodiment 2

An example of a top surface diagram of a pixel of an EL panel after inspection using the inspection method of the present invention is shown in embodiment 2.

Figure 9A:
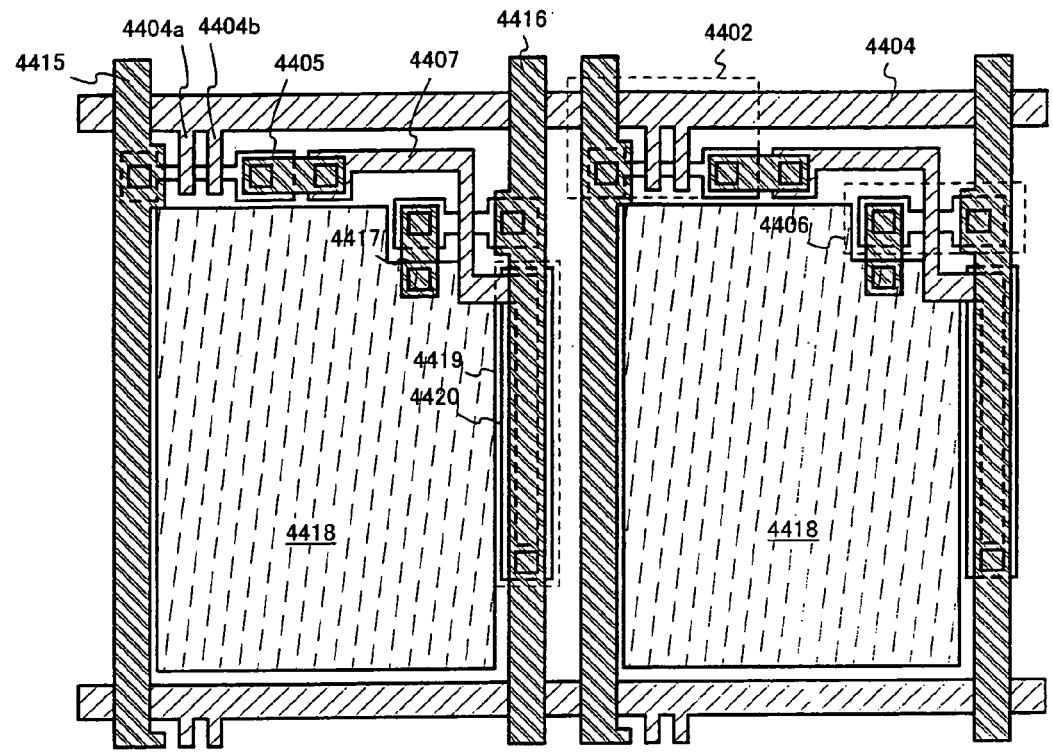
FIGS. 9A and 9B are a enlarged diagram and a circuit diagram, respectively, of a pixel of an EL panel after applying the inspection method of the present invention.
Figure 9B:
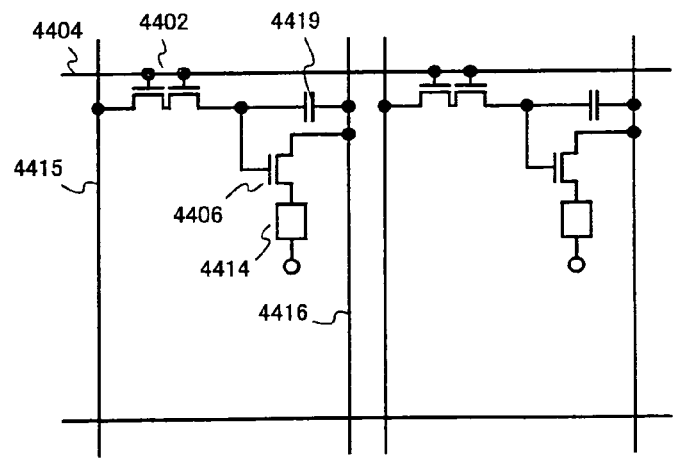

FIG. 9A shows a top surface diagram of a pixel in the embodiment 2, and FIG. 9B shows a circuit diagram of the pixel. Reference numeral 4402 denotes a switching TFT, and reference numeral 4406 denotes an EL driver TFT.

The switching TFT 4402 has gate electrodes 4404a and 4404b, portions of a gate signal line 4404. A source region of the switching TFT 4402 is connected to a source signal line 4415, and a drain region of the switching TFT 4402 is connected to a drain wiring 4405. Further, the drain wiring 4405 is electrically connected to a gate electrode 4407 of the EL driver TFT 4406. A source region of the EL driver TFT 4406 is electrically connected to an electric power source supply line 4416, and a drain region of the EL driver TFT 4406 is electrically connected to a drain wiring 4417. In addition, the drain wiring 4417 is electrically connected to a pixel electrode 4418.

A capacitor is formed at this point in a region denoted by reference numeral 4419. The capacitor 4419 is formed by a semiconductor film 4420, an insulating film (not shown in the figure) on the same layer as a gate insulating film, and the gate electrode 4407. Further, it is possible to use a capacitance formed by the gate electrode 4407, a layer which is the same as a first interlayer insulating film, and the electric power source supply line 4416 as a capacitor.

The pixel electrode does not overlap with the source signal line 4415 and the electric power source supply line 4416 in embodiment 2, but a structure in which they overlay through an interlayer insulating film may also be used.

Furthermore, although not shown in the figure, an EL layer and an opposing electrode are laminated in order on the pixel electrode 4418, forming an EL element 4414.

Embodiment 3

In the EL panel shown in FIG. 5, a method of manufacturing a pixel portion, and TFTs (n-channel TFTs and p-channel TFTs) of a driver circuit provided in the periphery of the pixel portion, on the same substrate at the same tome, applying the first method of inspection, is explained in detail in Embodiment 3.

Figure 10A:
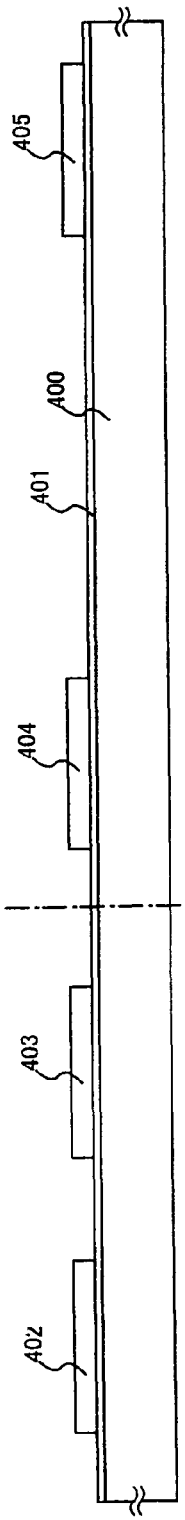
FIGS. 10A to 10D are diagrams showing a method of manufacturing an EL panel applying the inspection method of the present invention.

First, as shown in FIG. 10A, a base film 401 made of an insulating film such as a silicon oxide film, a silicon nitride film, or a silicon oxynitride film is formed on a substrate 400 made from glass, such as barium borosilicate glass or aluminum borosilicate glass, typically Corning Corp. #7059 glass or #1737 glass, or quartz. For example, a silicon oxynitride film manufactured from $SiH_4$, $NH_3$, and $N_2O$ by plasma CVD is formed with a thickness of 10 to 200 nm (preferably from 50 to 100 nm), and a hydrogenated silicon oxynitride film with a thickness of 50 to 200 nm (preferably between 100 and 150 nm), manufactured from $SiH_4$ and $N_2O$, is similarly formed and laminated. Note that the two layer structure base film 401 is shown as one layer in FIG. 10A. An example in which the base film 401 is of a two layer structure is shown in Embodiment 1, but it may also be formed as a single layer of one of the above insulating films, or a lamination structure in which two or more layers are laminated.

Semiconductor layers 402 to 405 are formed by a crystalline semiconductor film manufactured by using a laser crystallization method on a semiconductor film having an amorphous structure, or by using a known thermal crystallization method. The thickness of the semiconductor layers 402 to 405 is set from 25 to 80 nm (preferably between 30 and 60 nm). There are no limitations on the crystalline semiconductor film material, but it is preferable to form the film from a semiconductor material such as silicon or a silicon germanium (SiGe) alloy.

Regarding known crystallization methods, there are a thermal crystallization method using an electric furnace, a laser annealing crystallization method using laser light, a lamp annealing crystallization method using infrared light, and a crystallization method using a catalyst metal.

A laser such as a pulse emission type or continuous emission type excimer laser, a YAG laser, or a $YVO_4$ laser can be used as a laser light source used in the laser crystallization method for manufacturing a crystalline semiconductor film. A method of condensing laser light emitted from a laser emission device into a linear shape by an optical system and then irradiating the light to the semiconductor film may be employed when these types of lasers are used. The crystallization conditions may be suitably selected by the operator, but, the pulse emission frequency is set to 300 Hz, and the laser energy density is set form 100 to 400 mJ/cm$^2$ (typically between 200 and 300 mJ/cm$^2$) when using the excimer laser. Further, the second harmonic is utilized when using the YAG laser, the pulse emission frequency is set from 30 to 300 KHz, and the laser energy density may be set from 300 to 600 mJ/cm$^2$ (typically between 350 and 500 mJ/cm$^2$). The laser light which has been condensed into a linear shape with a width of 100 to 1000 μm, for example 400 μm, is then irradiated over the entire surface of the substrate. This is performed with an overlap ratio of 50 to 90% for the linear shape laser light.

A gate insulating film 406 is formed covering the semiconductor layers 402 to 405. An insulating film containing silicon is formed with a thickness of 40 to 150 nm by plasma CVD or sputtering as the gate insulating film 406. A 120 nm thick silicon oxynitride film is formed in Embodiment 3. The gate insulating film 406 is not limited to this type of silicon oxynitride film, of course, and other insulating films containing silicon may also be used, in a single layer or in a lamination structure. For example, when using a silicon oxide film, it can be formed by plasma CVD with a mixture of TEOS (tetraethyl orthosilicate) and O$_2$, at a reaction pressure of 40 Pa, with the substrate temperature set from 300 to 400° C., and by discharging at a high frequency (13.56 MHZ) electric power density of 0.5 to 0.8 W/cm$^2$. Good characteristics of the silicon oxide film thus manufactured as a gate insulating film can be obtained by subsequently performing thermal annealing at between 400 and 500° C.

A first gate electrode conductive film 407 and a second gate electrode conductive film 408 are then formed on the gate insulating film 406 in order to form gate electrodes. The first gate electrode conductive film 407 is formed from Ta with a thickness of 50 to 100 nm, and the second gate electrode conductive film 408 is formed by W having a thickness of 100 to 300 nm, in Embodiment 3.

The Ta film is formed by sputtering, and sputtering of a Ta target is performed by using Ar. If appropriate amounts of Xe and Kr are added to the Ar during sputtering, the internal stress of the Ta film will be relaxed, and film peeling can be prevented. The resistivity of an α phase Ta film is on the order of 20 μΩcm, and it can be used in the gate electrode, but the resistivity of a β phase Ta film is on the order of 180 μΩcm and it is unsuitable for the gate electrode. An α phase Ta film can easily be obtained if a tantalum nitride film, which possesses a crystal structure near that of α phase Ta, is formed with a thickness of 10 to 50 nm as a base for Ta in order to form the α phase Ta film.

The W film is formed by sputtering with W as a target. The W film can also be formed by thermal CVD using tungsten hexafluoride (WF$_6$). Whichever is used, it is necessary to make the film low resistant in order to use it as the gate electrode, and it is preferable that the resistivity of the W film be made equal to or less than 20 μΩcm. The resistivity can be lowered by enlarging the crystals of the W film, but for cases in which there are many impurity elements such as oxygen within the W film, crystallization is inhibited, and the film becomes high resistant. A W target having a purity of 99.9999% is thus used in sputtering. In addition, by forming the W film while taking sufficient care that no impurities from the inside of the gas phase are introduced at the time of film formation, a resistivity of 9 to 20 μΩcm can be achieved.

Figure 10B:
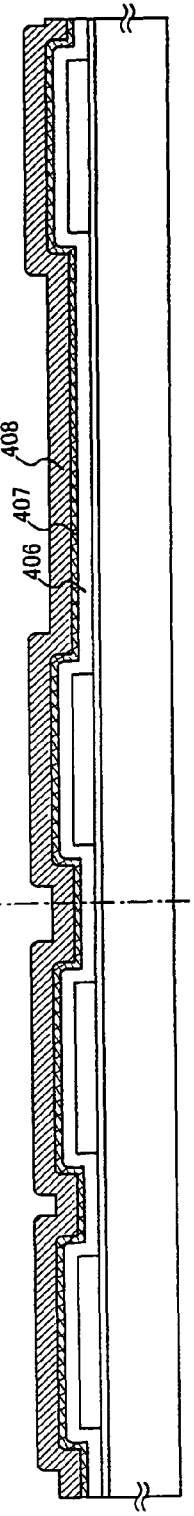

Note that, although the first gate electrode conductive film 407 is Ta and the second gate electrode conductive film 408 is W in Embodiment 3, the conductive films are not limited to these as long as conductive materials which have selectivity are used. The first gate electrode conductive film 407 and the second gate electrode conductive film 408 may both also be formed from an element selected from the group consisting of Ta, W, Ti, Mo, Al, and Cu, from an alloy material having one of these elements as its main constituent, or from a chemical compound of these elements. Further, a semiconductor film, typically a polysilicon film, into which an impurity element such as phosphorous is doped may also be used. Examples of preferable combinations other than that used in Embodiment 3 include: the first gate electrode conductive film formed by tantalum nitride (TaN) and the second gate electrode conductive film formed from W; the first conductive film formed by tantalum nitride (TaN) and the second gate electrode conductive film formed from Al; and the first gate electrode conductive film formed by tantalum nitride (TaN) and the second gate electrode conductive film formed from Cu. (See FIG. 10B.)

Masks 409 to 412 are formed next from resist, and a first etching process is performed in order to form electrodes and wirings. An ICP (inductively coupled plasma) etching method is used in Embodiment 3. A gas mixture of CF$_4$ and Cl$_2$ is used as an etching gas, and a plasma is generated by applying a 500 W RF electric power (13.56 MHZ) to a coil shape electrode at 1 Pa. A 100 W RF electric power (13.56 MHZ) is also applied to the substrate side (test piece stage), effectively applying a negative self-bias voltage. The W film and the Ta film are both etched on the same order when CF$_4$ and Cl$_2$ are combined.

Figure 10C:
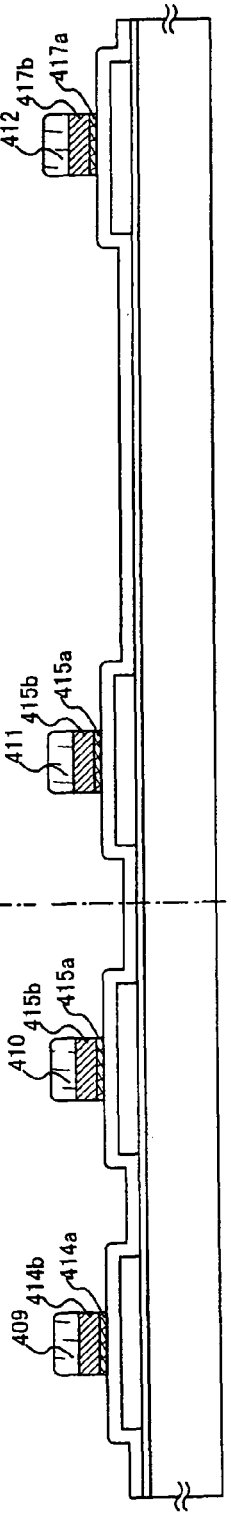

Note that, although not shown in FIG. 10C, edge portions of the first gate electrode conductive layer and the second gate electrode conductive layer are made into a tapered shape in accordance with the effect of the bias voltage applied to the substrate side with the above etching conditions by using a suitable resist mask shape. The angle of the tapered portions is from 15 to 45°. The etching time may be increased by approximately 10 to 20% in order to perform etching without any residue on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. Further, although not shown in FIG. 10C, regions of the gate insulating film 406 not covered by first shape conductive layers 414 to 417 are made thinner by approximately 20 to 50 nm by etching.

The first shape conductive layers 414 to 417 (first conductive layers 414a to 417a and second conductive layers 414b to 417b) are thus formed from the first conductive layer and the second conductive layer in accordance with the first etching process.

Figure 10D:
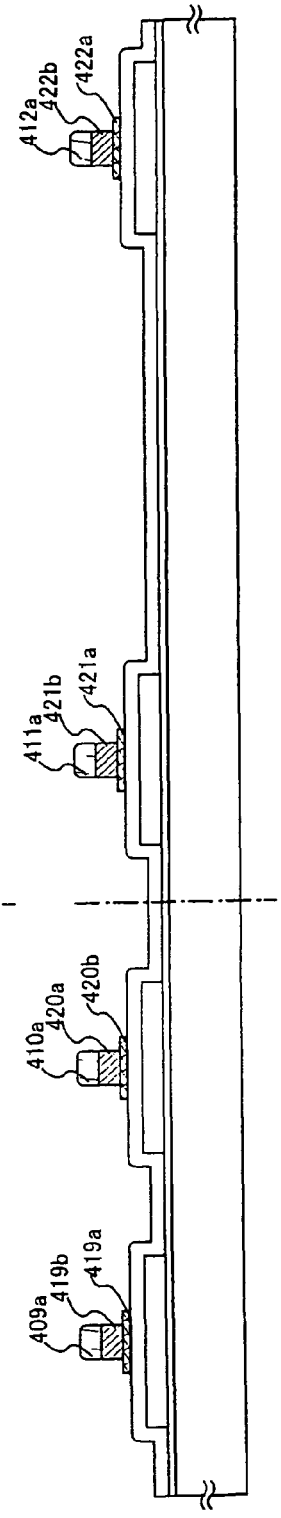

A second etching process is performed next, as shown in FIG. 10D. The ICP etching method is similarly used, a mixture of CF$_4$, Cl$_2$, and O$_2$ is used as the etching gas, and a plasma is generated by supplying a 500 W RF electric power (13.56 MHZ) to a coil shape electrode at a pressure of 1 Pa. A 50 W RF electric power (13.56 MHZ) is applied to the substrate side (test piece stage), and a self-bias voltage which is lower in comparison to that of the first etching process is applied. The W film is etched anisotropically under these etching conditions, and Ta (the first conductive layers) is anisotropically etched at a slower etching speed, forming second shape conductive layers 419 to 422 (first conductive layers 419a to 422a and second conductive layers 419b to 422b). Further, although not shown in FIG. 10D, the gate insulating film 406 is additionally etched on the order of 20 to 50 nm, becoming thinner, in regions not covered by the second shape conductive layers 419 to 422.

The etching reaction of the W film and the Ta film in accordance with the mixed gas of $CF_4$ and $Cl_2$ can be estimated from the radicals generated, and from the ion types and-vapor pressures of the reaction products. Comparing the vapor pressures of W and Ta fluorides and chlorides, the W fluoride compound $WF_6$ is extremely high, and the vapor pressures of $WCl_5$, $TaF_5$, and $TaCl_5$ are of similar order. Therefore the W film and the Ta film are both etched by the $ClF_4$ and $Cl_2$ gas mixture. However, if a suitable quantity of $O_2$ is added to this gas mixture, $CF_4$ and $O_2$ react, forming CO and F, and a large amount of F radicals or F ions is generated. As a result, the etching speed of the W film having a high fluoride vapor pressure becomes high. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. It therefore becomes possible to have a difference in etching speeds between the W film and the Ta film, and it becomes possible to make the etching speed of the W film larger than that of the Ta film.

Figures 11A, 11B, 11C:
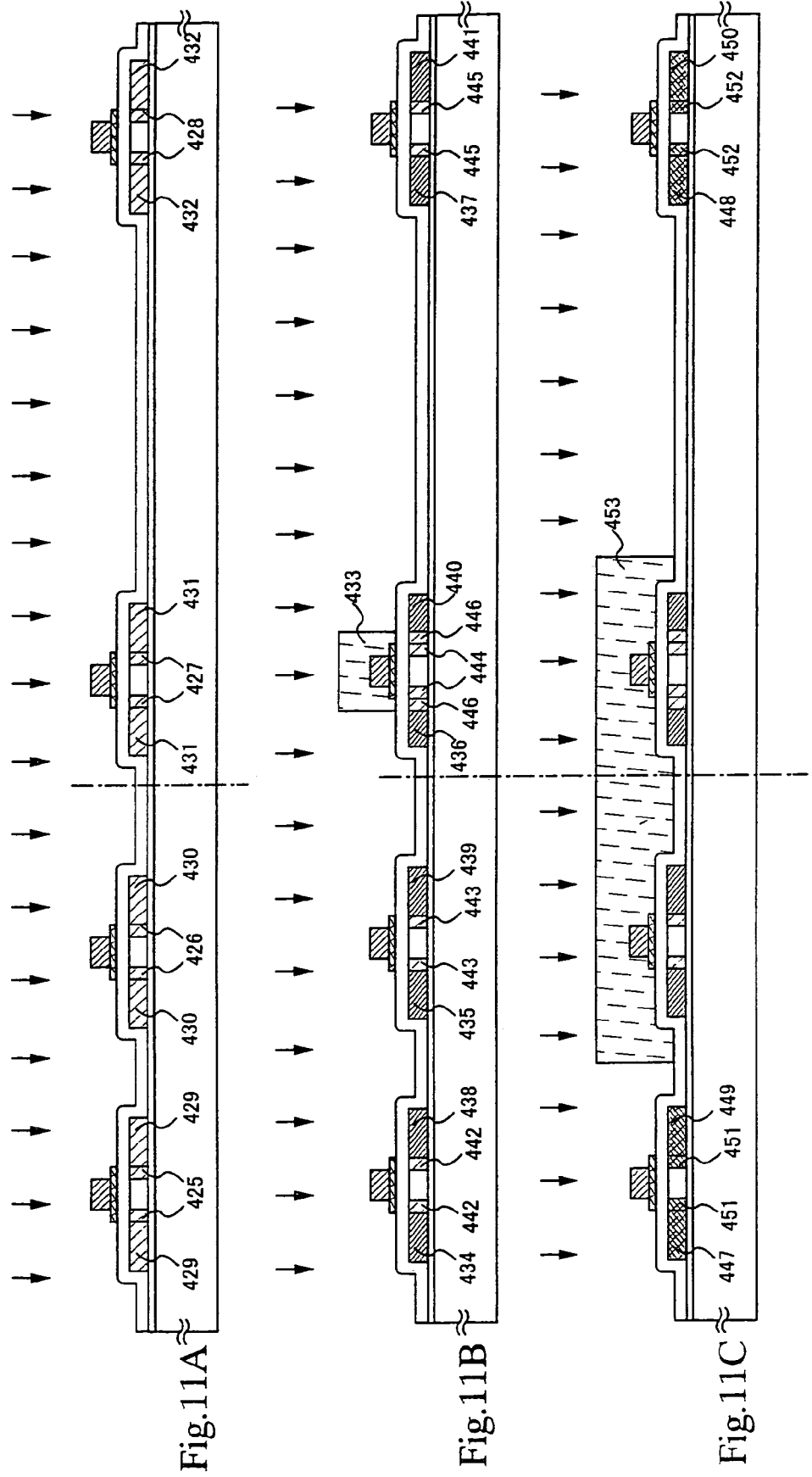
FIGS. 11A to 11C are diagrams showing the method of manufacturing an EL panel applying the inspection method of the present invention.

The masks 409a to 412a are removed, and a first doping process is performed as shown in FIG. 11A, adding an impurity element which imparts n-type conductivity. For example, doping may be performed at an acceleration voltage of 70 to 120 keV and with a dosage of $1\times10^{13}$ atoms/cm². The doping process is performed using the second shaped conductive layers 419b to 422b as masks against the impurity element, so as to also add the impurity element in regions below the second conductive layers 419a to 422a. Second impurity regions 419a to 422a, which overlap with the second conductive layers 419a to 422a, and second impurity regions 429 to 432, which have a higher impurity concentration than the first impurity regions, are thus formed. Note that the n-type conductivity imparting element is added after removing the masks 409a to 412a in Embodiment 3, but the present invention is not limited to this. The impurity element which imparts n-type conductivity may also be added in the step of FIG. 11A, and then the masks 409a to 412a may be removed.

A mask 433 from resist is next formed on the semiconductor layer 404 so as to cover the second conductive layers 421a, 421b. A portion of the mask 433 overlaps with the second impurity region 431, sandwiching the gate insulating film 406. A second doping process is then performed, and an impurity element which imparts n-type conductivity is added. Doping of the n-type conductivity imparting impurity element is performed at conditions in which the dosage is raised higher than that of the first doping process, and at a low acceleration voltage. (See FIG. 11B.) Ion doping or ion injection may be performed for doping. Ion doping is performed under conditions of a dose amount from $1\times10^{13}$ to $5\times10^{14}$ atoms/cm² and an acceleration voltage of 60 to 100 keV. A periodic table group 15 element, typically phosphorous (P) or arsenic (As), is used as the impurity element which imparts n-type conductivity, and phosphorous (P) is used here. The second shape conductive layers 419 and 422 become masks with respect to the n-type conductivity imparting impurity element in this case, and source regions 434 to 437, drain regions 438 to 441, and Lov regions 442 and 445 are formed in a self-aligning manner. Further, an Loff region 446 is formed in accordance with the mask 433. The impurity element which imparts n-type conductivity is added to the source regions 434 to 437, and to the drain regions 438 to 441 with a concentration in the range of $1\times10^{20}$ to $1\times10^{21}$ atoms/cm³.

It is possible to freely set the length of the $L_{off}$ region 446 in the direction which the carrier moves by controlling the size of the mask 433 with the present invention.

In this specification, the LED region which is overlapped with a gate insulating film interposing the gate insulating film is called $L_{ov}$ region. The LDD region which is not overlapped with the gate insulating film is called $L_{off}$ region.

The n-type conductivity imparting impurity element is added so as to form a concentration of $1\times10^{17}$ to $1\times10^{19}$ atoms/cm³ in the Loff region, and a concentration of $1\times10^{16}$ to $3\times10^{18}$ atoms/cm³ in the Lov regions.

Note that, in FIG. 11B, an impurity element which imparts n-type conductivity may also be doped at an acceleration voltage of 70 to 120 keV, in the state in which the mask 443 is formed on the semiconductor layer 404, before or after doping the n-type conductivity imparting impurity element under the above stated conditions. The concentration of the impurity element which imparts n-type conductivity is suppressed in the portion 446 which becomes the $L_{off}$ region of the switching TFT by the above process, and the concentration of the n-type conductivity imparting impurity element in the portion 442, 443 which becomes the $L_{ov}$ region of the TFT used in the driver circuit can be increased. It is possible to reduce the off current in the pixel TFT by suppressing the concentration of the n-type conductivity imparting impurity element in the portion 446 which becomes the $L_{off}$ region of the switching TFT. Further, by increasing the concentration of the n-type conductivity imparting impurity element in the portion 443 which becomes the $L_{ov}$ region of the n-channel TFT used in the driver circuit, the degradation phenomenon caused by hot carriers, due to the hot carrier effect, generated in accordance with a high electric field in the vicinity of the drain, can be prevented.

A source region 447, 448, a drain region 449, 450, and a Lov region 451, 452, into which an impurity element having a conductivity type which is the inverse of the above single conductivity type, are then formed in the p-channel TFT forming semiconductor layers 402, 405, as shown in FIG. 11C after removing a mask 433. The second shape conductive layers 419, 422 are used as a mask with respect to the impurity element, and the impurity regions are formed in a self-aligning manner. The entire surfaces of the semiconductor layers 402 and 403, which form n-channel TFTs, are covered by a resist mask 453 at this point. Phosphorous is already added in differing concentrations to the source region 447, 448, the drain region 449, 450, and the Lov region 451, 452, and ion doping is performed here using diborane ($B_2H_6$), so that boron is also added to each of the regions with a concentration of $2\times10^{20}$ to $2\times10^{21}$ atoms/cm³.

Impurity regions (source regions, drain regions, $L_{ov}$ regions, and $L_{off}$ regions) are formed in the respective semiconductor layers 402 to 405 by the above processes. The second shape conductive layers 419 to 422 overlapping the semiconductor layers function as gate electrodes.

A process of activating the impurity elements added to the respective semiconductor layers is then performed, with the aim of controlling conductivity type. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen atmosphere at 400 to 700° C., typically between 500 and 600° C. Heat treatment is performed for 4 hours at 500° C. in Embodiment 3. However, for cases in which the conductive material used in the second conductive layers 419 to 422 is weak with respect to heat, it is preferable to perform activation after forming an interlayer insulating film (having silicon as its main constituent) in order to protect the gate electrodes, the wirings and the like.

In addition, heat treatment is performed for 1 to 12 hours at 300 to 450° C. in an atmosphere containing between 3 and 100% hydrogen, performing hydrogenation of the semiconductor layers. This process is one of terminating dangling bonds in the island shape semiconductor layers by hydrogen which is thermally excited. Plasma hydrogenation (using hydrogen excited by a plasma) may also be performed as another means of hydrogenation.

Figure 12A:
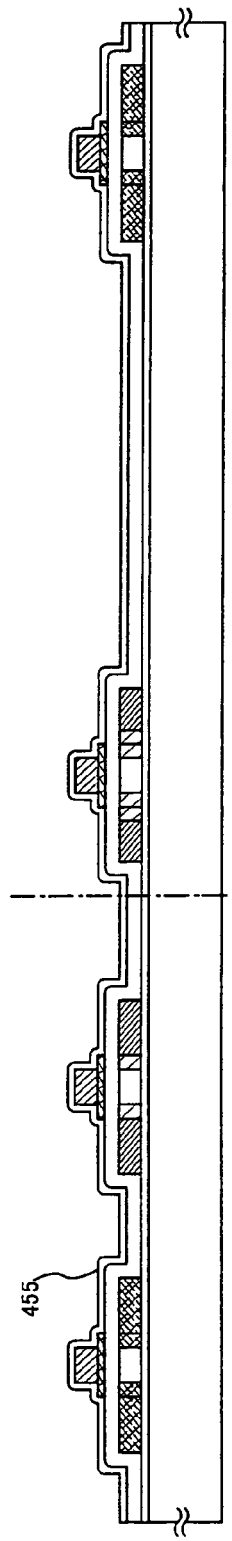
FIGS. 12A to 12C are diagrams showing the method of manufacturing an EL panel applying the inspection method of the present invention.

A first interlayer insulating film 455 is formed next from a silicon oxynitride film having a thickness of 100 to 200 nm. (See FIG. 12A.) A second interlayer insulating film 458 made from an organic insulating material is then formed on the first interlayer insulating film 455.

Figure 12B:
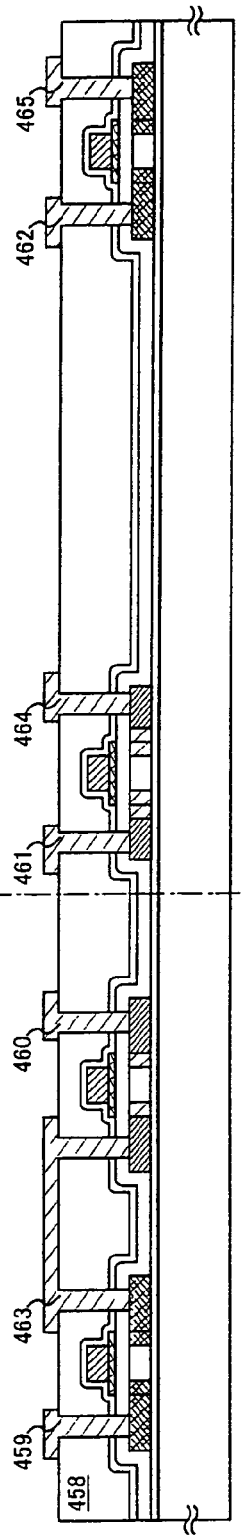

Contact holes are then formed in the gate insulating film 406, the first interlayer insulating film 455, and the second interlayer insulating film 458, and source wirings 459 to 462 are formed so as to contact the source regions 447, 435, 436 and 448 through the contact holes. Further, a drain wirings 463 to 465 is formed at the same time contacting the drain regions 449, 439, 440 and 450 (See FIG. 12B.)

Note that it is preferable to form the contact holes by dry etching using $CF_4$ and $O_2$ when the gate insulating film 406, the first interlayer insulating film 455 and the second interlayer insulating film 458 are $SiO_2$ films or SiON films. Further, for cases in which the gate insulating film 406, the first interlayer insulating film 455 and the second interlayer insulating film 458 are organic resin films, it is preferable to form the contact holes by dry etching using $CHF_3$ or by BHF (buffered hydrogen fluoride, $HF+NH_4F$). In addition, if the gate insulating film 406, the first interlayer insulating film 455 and the second interlayer insulating film 458 are formed by different materials, it is preferable to change the method of etching and the etchant or etching gas type for each film. However, the contact holes may also be formed by using the same etching method and the same etchant or etching gas.

A third interlayer insulating film 467 is formed next from an organic resin. Organic resins such as polyimide, polyamide, acrylic, and BCB (benzocyclobutene) can be used. In particular, it is preferable to use acrylic, which has superior levelness, because the third interlayer insulating film 467 is formed with a strong implication of leveling. An acrylic film is formed in Embodiment 3 at a film thickness at which steps formed by the TFTs can be sufficiently leveled. The film thickness is preferable from 1 to 5 μm (more preferably between 2 and 4 μm).

A contact hole for reaching the drain wiring 465 is formed next in the third interlayer insulating film 467, and conductive film 466 which is for a pixel electrode is formed on the pixel portion. (See FIG. 12C.) An indium tin oxide (ITO) film is formed with a thickness of 110 nm in Embodiment 3, and forming the conductive film 466. Further, a conductive film 466 in which between 2 and 20% zinc oxide (ZnO) is mixed with indium oxide may also be used. A film formed from zinc oxide (ZnO) or a film formed from tin oxide ($In_2O_3$). In this invention, the occurrence of the short-circuiting of the conductive film 466 for the pixel electrode and a portion other than the drain region of the EL driver TFT must be prevented, and this can be realized by forming the conductive film 466 on the third interlayer insulating film In the state of FIG. 12C, each pixel is selected by first inspection method of the present invention and a value of electric current of the conductive film 467 is measured.

After the measurement, the pixel electrode 468 is formed by patterning the conductive film 466. The pixel electrode 468 is an anode of an EL element. (See FIG. 13A.)

A first bank 496 and a second bank 470 are formed next from a resin material. The first bank 469 and the second bank 470 are formed in order to separate EL layers and cathodes, formed later, of adjacent pixels. It is therefore preferable that the second bank 470 stick out farther horizontally than the first bank 469. Note that it is preferable that the combined thickness of the first bank 469 and the second bank 470 be made on the order of 1 to 2 μm, but there are no limitations on this thickness provided that the EL layers and the cathodes formed later of adjacent pixels can be separated. Further, it is necessary to form the first bank 469 and the second bank 470 by an insulating film, and it is therefore possible to use materials such as an oxide or a resin, for example. The first bank 469 and the second bank 470 may both be formed by the same material, and they may also be formed by different materials. The first bank 469 and the second bank 470 are formed in stripe shapes between pixels. The first bank 469 and the second bank 470 may be formed on and along the source wirings (source signal lines), and may be formed on and along the gate wirings (gate signal lines). Note that the first bank 469 and the second bank 470 may also be formed by a material in which a pigment is mixed into a resin. (See FIG. 13A.)

An EL layer 471 and a cathode (MgAg electrode) 472 are formed next in succession without exposure to the atmosphere using vacuum evaporation. Note that the film thickness of the EL layer 471 may be from 80 to 200 nm (typically between 100 and 120 nm), and that the film thickness of the cathode 472 may be from 180 to 300 nm (typically between 200 and 250 nm). Note also that, although only one pixel is shown in Embodiment 3, an EL layer which emits red color light, an EL layer which emits green color light, and an EL layer which emits blue color light are formed at the same time at this point. Though materials which form the EL layer and the cathode are laminated on the bank 470, these materials are not included in the EL layer 471 and the cathode 472 in this specification.

The EL layer 471 and the cathode 472 are formed in order for a pixel corresponding to the color red, a pixel corresponding to the color green, and a pixel corresponding to the color blue. However, the EL layer 471 and the cathode 472 have scant resistance with respect to solutions, and therefore each color must be formed separately without using a photolithography technique. It is preferable to use a metal mask and cover the pixels other than the desired pixel, and selectively form the EL layers 471 and the cathode 472 in only the required locations.

Namely, first a mask is set so as to cover all of the pixels except for those corresponding to the color red, and red color light-emitting EL layer and the cathode are selectively formed using the mask. Next, a mask is set so as to cover all of the pixels except for those corresponding to the color green, and green color light-emitting EL layer and the cathode are selectively formed using the mask. Finally, a mask is set so as to cover all of the pixels except for those corresponding to the color blue, and blue color light-emitting EL layer and the cathode are selectively formed using the mask. Note that, although the use of all different masks is recorded here, the same mask may also be reused. Further, it is preferable to perform processing until all pixel EL layer and the cathode are formed without releasing the vacuum.

Note that a single layer structure composed of only a light-emitting layer is shown in Embodiment 3 for the EL layer 471, but a structure having layers such as a hole transporting layer, a hole injecting layer, an electron transporting layer, and an electron injecting layer in addition to the light-emitting layer may also be used for the EL layer. Various examples of these types of combinations have already been reported, and all such structures may be used. A known material can be used as the EL layer 471. Considering the EL driver voltage, it is preferable to use an organic material as the known material. In this embodiment, an example of using the MgAg electrode as a cathode of EL element, other known material is also can be used.

An EL panel having a structure as shown in FIG. 13B is thus completed. Note that, after forming the first bank 469 and the second bank 470, it is effective to perform processing in succession without exposure to the atmosphere up through to the formation of the cathode 472 by using a multi-chamber method (or an in-line method) thin film formation apparatus.

In Embodiment 3, a source region 504, a drain region 505, an $L_{off}$ region 506, an $L_{ov}$ region 507, and a channel forming region 508 are contained in a semiconductor layer of a switching TFT 501. The $L_{off}$ region 506 is formed so as not to overlap with the gate electrode 421 through the gate insulating film 406. Further, the $L_{ov}$ region 507 is formed so as to overlap with the gate electrode 421 through the gate insulating film 406. This type of structure is extremely effective in reducing the off current.

Further, a single gate structure is used as the switching TFT 501 in Embodiment 3, but the present invention may also have a double gate structure or another type of multi-gate structure for the switching TFT. Two TFTs are effectively connected in series by using the double gate structure, giving the advantage of additionally reducing the off current.

Further, the switching TFT 501 is an n-channel TFT in Embodiment 3, but a p-channel TFT may also be used.

A semiconductor layer of an EL driver TFT 502 contains a source region 510, a drain region 511, an $L_{ov}$ region 512, and a channel forming region 513. The $L_{ov}$ region 512 is formed so as to overlap with the gate electrode 422 through the gate insulating film 406. Note that the EL driver TFT 502 does not have an $L_{off}$ region in Embodiment 3, but a structure having an Loff region may also be used.

Further, the EL driver TFT 502 is a p-channel TFT in Embodiment 3, but it may also be an n-channel TFT.

First, a TFT having a structure in which hot carrier injection is reduced so as not to have a very large drop in operational speed is used as an n-channel TFT 503 of a CMOS circuit forming the driver circuit portion. Note that circuits such as a shift register, a buffer, a level shifter, and a sampling circuit (sample and hold circuit) are included as the driver circuits here. Signal conversion circuits such as a D/A converter can also be included when performing digital drive.

A semiconductor layer of the n-channel TFT 503 of the CMOS circuit in Embodiment 3 contains a source region 521, a drain region 522, an $L_{ov}$ region 523, and a channel forming region 524.

Further, a semiconductor layer of a p-channel TFT 504 of the CMOS circuit contains a source region 531, a drain region 532, an Lov region 533, and a channel forming region 534.

Note that, in practice, it is preferable to perform packaging (sealing) by a protecting film having high airtight characteristics and little outgassing (such as a laminate film or an ultraviolet hardened resin film) or by a transparent sealing material after completing up through to the processes of FIG. 13B so as to have no exposure to the atmosphere. Further, if an inert gas is placed in the inside of the sealing material, and a drying agent (barium oxide, for example) is arranged on the inside of the sealing material, then the reliability of the EL element is increased.

Further, a connector (flexible printed circuit, FPC) is attached in order to connect the elements formed on the substrate, with terminals extended from the circuits, to external signal terminals after increasing the airtight characteristics in accordance with the packaging process or the like. A manufactured product is thus completed. This type of deliverable state is referred to as an EL display device throughout this specification.

The length of the channel long direction of the gate electrodes (hereinafter referred to as the widths of the gate electrode) differ from each other in the manufacturing method of the present invention as stated above. Therefore, it is possible to make the ion concentration within the semiconductor layers arranged under the first gate electrode less than the ion concentration within the semiconductor layers not arranged under the first gate electrode by utilizing the difference in ion penetration depth, due to the differing gate electrode thicknesses, when performing ion injection using the gate electrodes as masks.

Further, in order to form the $L_{off}$ regions using a mask, only the width of the $L_{ov}$ region need to be controlled by etching. It therefore becomes easy to have precise positional alignment of the $L_{ov}$ regions and the $L_{off}$ regions The first inspection method of the present invention is not applied only to the EL display device shown in Embodiment 3, it is also used to other various EL display device.

The first inspection method of the present invention is performed by measurement of the value of the electric current flowing the conductive film and the conductive film having conductivity to be a pixel electrode. Thus the pixel electrode can be formed by patterning the conductive film after the examination. Therefore, the number of process need not to be increased for the examination.

Figure 12C:
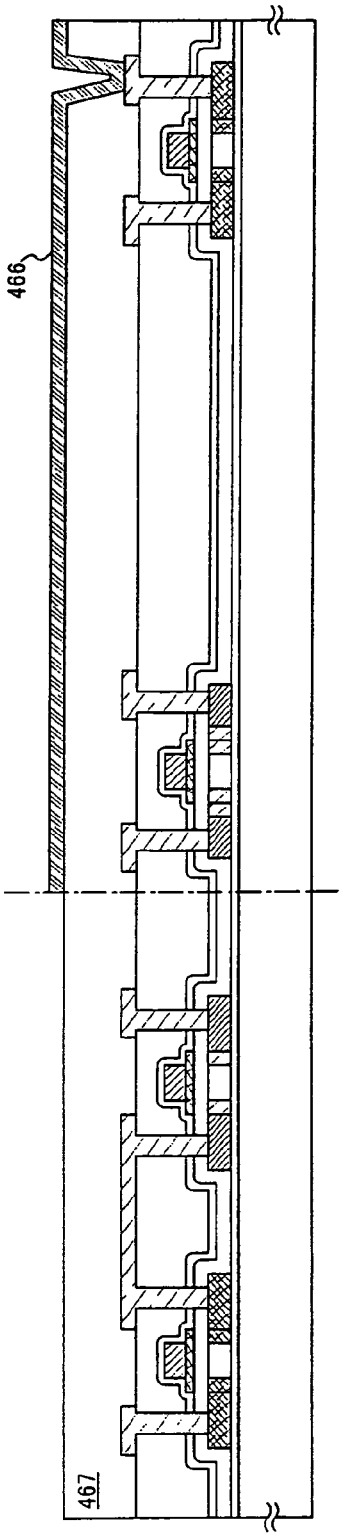

Next, in the case of using a second inspection method is explained. The steps before FIG. 12C are same as the manufacturing method with the first inspection method. After the step of FIG. 12C, the conductive film 466 for the pixel electrode is formed and the pixel electrode 468 is formed by patterning. (See FIG. 14.) An indium tin oxide (ITO) film is formed with a thickness of 110 nm in Embodiment 3, and the pixel electrode 468 is formed by patterning. Further, a material in which zinc oxide (ZnO) of 2 to 20% is mixed with indium oxide may also be used for the pixel electrode 468. A film formed of zinc oxide (ZnO) or a film formed of tin oxide ($In_2O_3$) may be used. The pixel electrode 468 is to be an anode of an EL element.

Next, the inspection conductive film 480 is formed on the above mentioned third interlayer insulating film 467 to contact with the pixel electrode 468. The inspection conductive film 480 is formed to connect electrically all of the pixel electrodes 468 in the pixel portion. Further it is important that the inspection conductive film 480 is not formed in the driver portion including the source signal driver circuit and the gate signal driver circuit but only in the pixel portion. In this embodiment, the inspection conductive film 480 of polyacetylene is formed into 20 μm thickness using a metal mask.

In the present invention, it is necessary to prevent the inspection conductive film 480 from short circuiting with a TFT or a wiring except for the pixel electrode 468, and the inspection conductive film 480 is formed on the third inlerlayer insulating film 467 in this embodiment.

Figure 14:
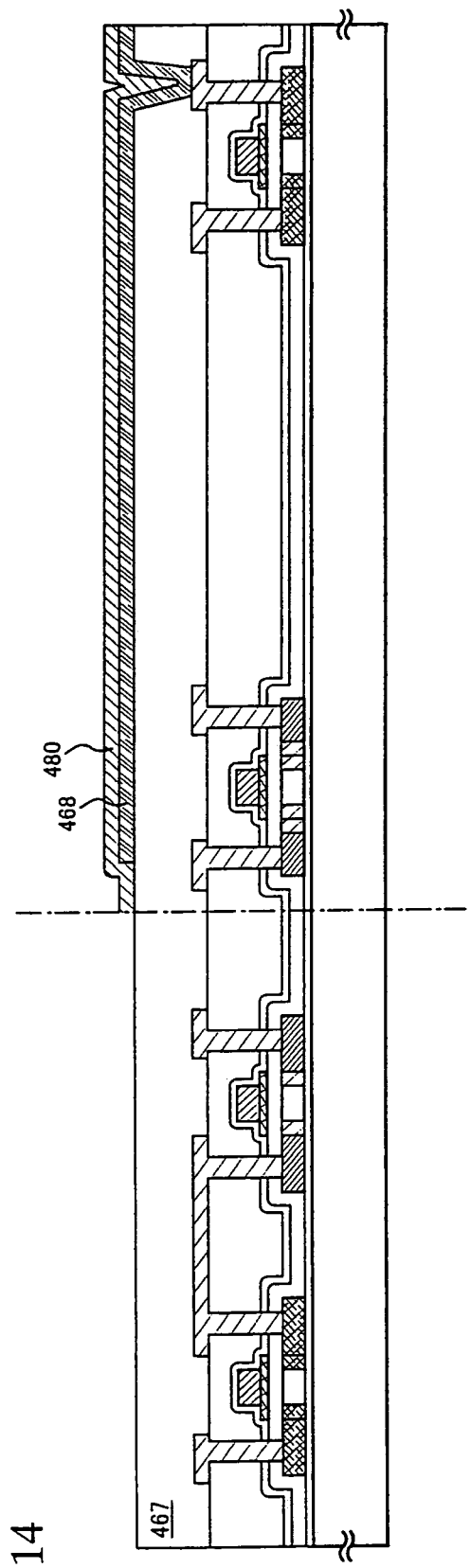
FIG. 14 is a diagram showing the method of manufacturing an EL panel applying the inspection method of the present invention.

In the state of FIG. 14, each pixel is selected by the inspection method of the present invention and a value of electric current flowing the inspection conductive film 480 is measured.

After the measurement, the inspection conductive film 480 is removed by solvent. (See FIG. 14.)

Next, the first bank 469 and the second bank 470 made of resin material are formed. Explanation about the following steps are omitted because they are same as the first inspection.

Note that although an example in which light emitted from the EL layer is directed toward the substrate is explained in Embodiment 3, the present invention is not limited to this, and a structure in which the light emitted from the EL layer is directed above the substrate may also be used. In this case, the cathode of the EL element becomes the pixel electrode, and it is preferable that the EL driver TFT be an n-channel TFT.

The constitution of this embodiment can be combined freely with constitutions of Embodiment 1 and 2.

Embodiment 4

An example of fabricating an EL (Electro Luminescence) display device using the EL panel determined as an excellent article by the examination of the present invention will be explained in embodiment 4. Note that FIG. 15A is a top view of an EL display device using the present invention, and FIG. 15B is a cross sectional view thereof.

Figure 15A:
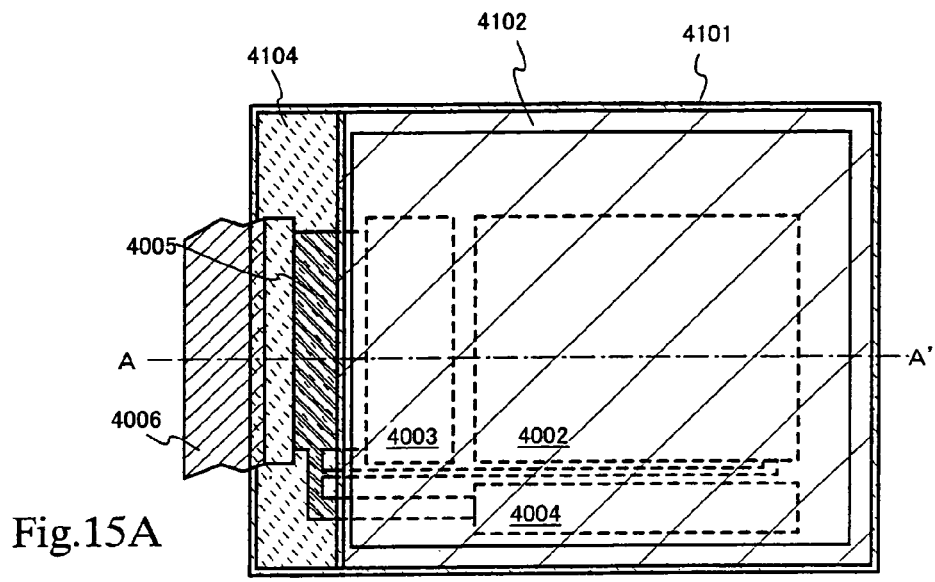
FIGS. 15A and 15B are a top surface diagram and a cross sectional diagram, respectively, of an EL display using an EL panel after applying the inspection method of the present invention.
Figure 15B:
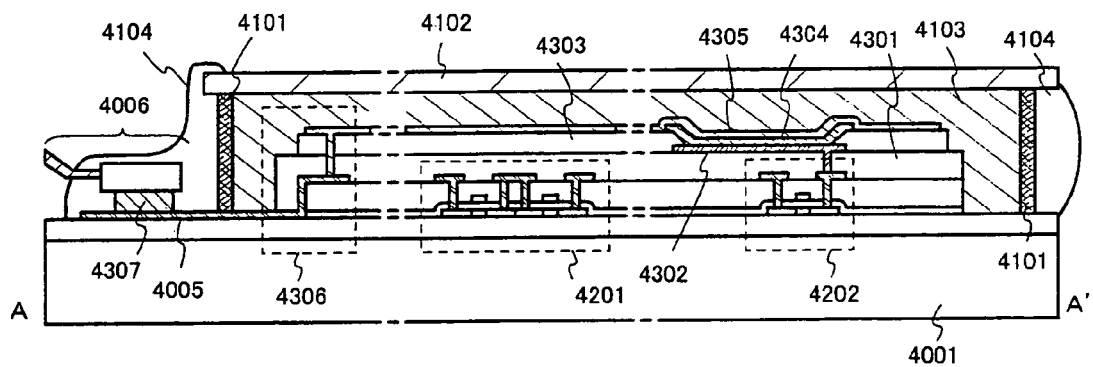

In FIG. 15A and FIG. 15B, reference numeral 4001 denotes a substrate, 4002 denotes a pixel portion, 4003 denotes a source signal driver circuit, 4004 denotes a gate signal driver circuit. The driver circuits are connected to external equipment, through an FPC (flexible printed circuit) 4006 via a wiring 4005.

At this time, a first sealing material 4101, a covering material 4102, a filer material 4103 and a second sealing material 4104 are provided so as to enclose the pixel portion 4002, source signal driver circuit 4003, and gate signal driver circuit 4004.

A cross sectional diagram of FIG. 15A cut along the line A-A' is shown in FIG. 15B. On the substrate 4001, a driver TFT 4201 included in the source signal driver circuit 4003 (an n-channel TFT and a p-channel TFT are shown here) and an EL driver TFT 4202 included in the pixel portion 4002 (a TFT for controlling the current flowing to an EL element is shown here) are formed.

In this embodiment, the driver TFT 4201 is fabricated using p-channel TFT or n-channel TFT forming by a known method, and the EL driver TFT 4202 is fabricated using p-channel TFT forming by a known method. Further, the storage capacitor (not shown in the figure) connected to the gate electrode of the EL driver TFT 4202 is provided in the pixel portion 4002.

An interlayer insulating film (leveling film) 4301 made from a resin material is formed on the driver TFT 4201 and the pixel TFT 4202, and a pixel electrode (anode) 4302 electrically connected to a drain of the pixel TFT 4202 thereon. The pixel electrode 4302 is formed from a transparent conductive film having large work function. As the transparent conductive film, an indium oxide and tin oxide compound or an indium oxide and zinc oxide compound can be utilized. Further, the above mentioned transparent conductive film with which is doped gallium can also be used.

Then, an insulating film 4303 is formed on the pixel electrode 4302, and an opening portion is formed on the pixel electrode 4302. At the opening portion, an EL (Electro Luminescence) layer 4304 is formed on the pixel electrode 4302. A known organic EL material or inorganic EL material is used as the EL layer 4304. Both of low molecular type (monomer based) organic EL materials and high molecular type (polymer based) organic EL materials can be used as the organic materials.

A known technique of evaporation method or painting method may be used to form the EL layer 4304. The EL layer may have a lamination structure by freely combining a hole injecting layer, a hole transporting layer, a light emitting layer, an electron transporting layer, and an electron injecting layer, or a single layer structure.

On the EL layer 4304, a cathode 4305 made of a conductive film having a light-shielding property (typically, a conductive film comprising aluminum, copper, or silver as a main component, or a lamination film of those and other conductive film) is formed. It is preferable to remove as much as possible any moisture or oxygen existing in the interface between the cathode 4305 and the EL layer 4304. It is therefore necessary to use a method of depositing continuously the cathode 4305 and the EL layer 4304 in vacuum or depositing the EL layer 4304 in an atmosphere of nitrogen or in a rare gas atmosphere, thereby a cathode 4305 is formed without exposing to oxygen and moisture. The above film deposition becomes possible in embodiment 4 by using a multi-chamber method (cluster tool method) film deposition apparatus.

Then, the cathode 4305 is electrically connected to the wiring 4005 in the region denoted by reference numeral 4306. The wiring 4005 for imparting a predetermined voltage to the cathode 4305 is connected to the FPC 4006 through an anisotropic conducting film 4307.

As mentioned above, an EL element is formed from the pixel electrode (anode) 4302, the EL layer 4304 and the cathode 4305. The EL element is enclosed with a covering material 4102 which is laminated with the substrate 4001 through a first sealing material 4101 and a first sealing material 4101, and sealed with a filer material 4103.

Materials such as a glass material, a metal material (typically, a stainless steel plate), a ceramic material, and a plastic material (including a plastic film) can be used as the covering material 4102. As a plastic material, an FRP (fiberglass-reinforced plastic) material, a PVF (polyvinyl fluoride) film, a Mylar film, a polyester film, and an acrylic resin film can be used. It is preferable to use a sheet structure in which aluminum foil is sandwiched by a PVF film or a Mylar film.

Note that, in a case in which the emission direction of light emitted from the EL element is directed to the covering material side, it is necessary for the covering material to possess transparency. In the case, a transparent material such as a glass plate, a plastic plate, a polyester film or an acrylic film can be used.

Additionally, a filler material 4103 is formed using ultraviolet curing resin or thermally curable resin. PVC (polyvinyl chloride), acrylic, polyimide, epoxy resin, silicone resin, PVB (polyvinyl butyral), and EVA (ethylene vinyl acetate) can be used as the filler material. If a drying agent (preferably, barium oxide) is formed on the inside of the filler material 4103, then it can suppress the degradation of the EL element.

Further, spacer may be contained in the filler material 4103. At this time, the spacer is formed by using barium oxide, thereby the spacer itself has a hygroscopic property. Further, in the case of providing the spacer, it is effective that a resin film is provided on the cathode 4305 as a buffer layer for relaxation of pressure from the spacer.

Further, the wiring 4005 is electrically connected to the FPC 4006 via the anisotropic conductive film 4307. The wiring 4005 transmits signals forwarding the pixel portion 4002, source side driver circuit 4003 and gate signal driver circuit 4004 to the FPC 4006 and are electrically connected to external equipment through the FPC 4006.

Also, in the present embodiment, a second sealing material 4104 is provided to cover an exposure portion of the first sealing material 4101 and portion of the FPC 4006 to obtain the structure in which the EL element is completely shut out from the outside. In this way, the EL display device has a cross sectional structure shown in FIG. 15B.

Embodiment 5

In the present embodiment, the pixel structure of the EL display device in accordance with the present invention will be described with reference to FIG. 16. In the present embodiment, reference numeral 4701 denotes source signal line including a source wiring of a switching TFT 4702, 4703 denotes gate signal line including a gate wiring of the switching TFT 4702, 4704 denotes an EL driver TFT, 4705 denotes a capacitor (that can be omitted), 4706 and 4710 denote a power source supply line, 4707 denotes a power source controlling TFT, 4709 and 4711 denotes a power source control gate wiring, and 4708 denotes an EL element. With respect to operations of the power source control TFT 4707, reference can be made to Japanese Patent Application No. 11-341272.

Although the power source control TFT 4707 is provided between the EL driver TFT 4704 and the EL element 4708 in the present embodiment, it is also possible to provide the EL driver TFT 4704 between the power source control TFT 4707 and the EL element 4708. Furthermore, the power source control TFT 4707 is preferably formed to have the identical structure with the EL driver TFT 4704, or to be connected in series with the EL driver TFT 4704 while utilizing the identical active layer thereto.

Figure 16A:
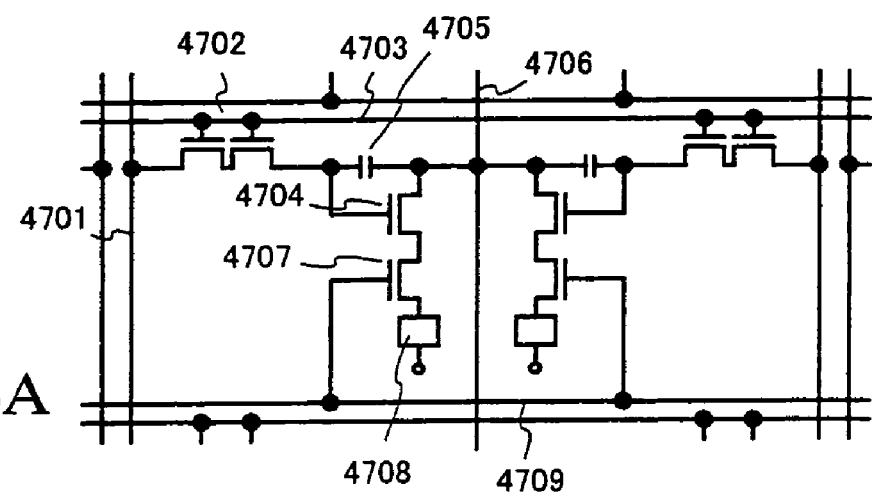
FIGS. 16A and 16B are circuit diagrams of a pixel of an EL panel after applying the inspection method of the present invention.

FIG. 16A illustrates an example in which the power source supply line 4706 is shared with the two pixels. More specifically, the two pixels are formed to be symmetric to each other with respect to the power source supply line 4706. In this case, the number of the necessary power source supply lines can be reduced, and thus the pixel section can be formed with higher precision.

Figure 16B:
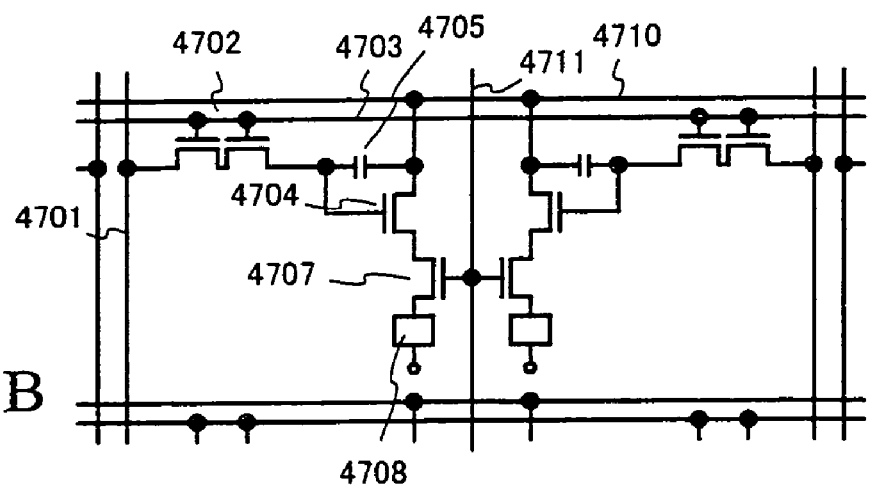

FIG. 16B shows an example in which the power source supply line 4710 is provided in parallel with the gate wiring 4703, and the power source control gate wiring 4711 is provided in parallel with the source signal line 4701. Note that, although FIG. 16B shows the structure in which the power source supply line 4710 does not overlap with the gate wiring 4703, if both are wirings formed in different layers, they can be provided so that they overlap with each other through an insulating film. In this case, since an occupied area can be made common to the power source supply line 4710 and the gate wiring 4703, the pixel portion can be further made fine.

The inspection method of the present intention can be applied to various EL displays having many kinds of structure pixels other than that shown in FIG. 16.

The structure as described in the present embodiment can be freely combined with any structures in Embodiments 2 through 4.

Embodiment 6

Figure 17A:
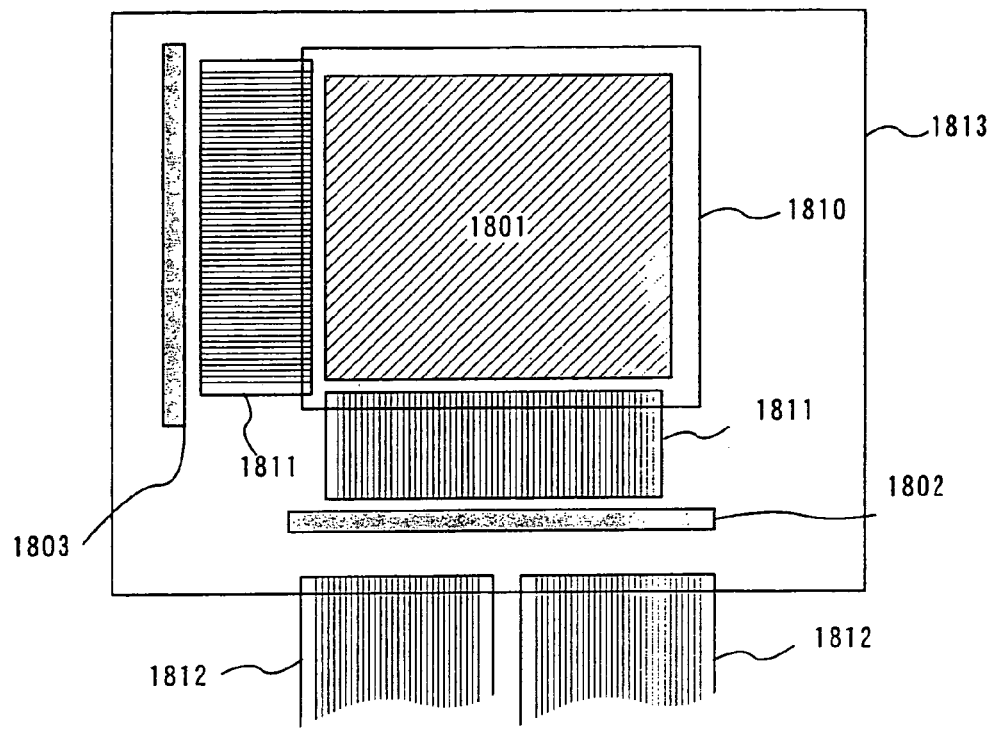
FIGS. 17A and 17B are top surface diagrams of a display panel with driver circuit after applying the inspection method of the present invention is attached.
Figure 17B:
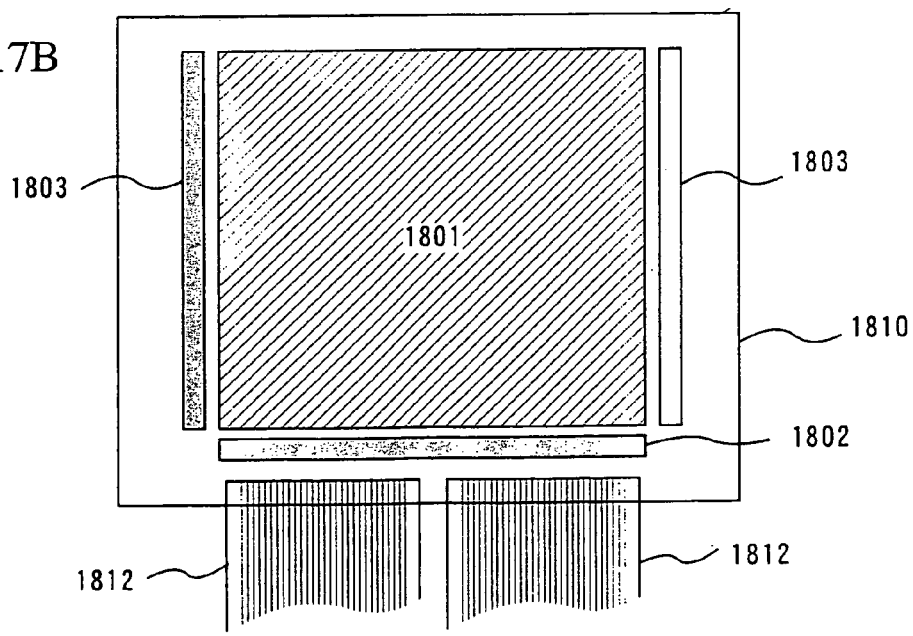
Figure 18:
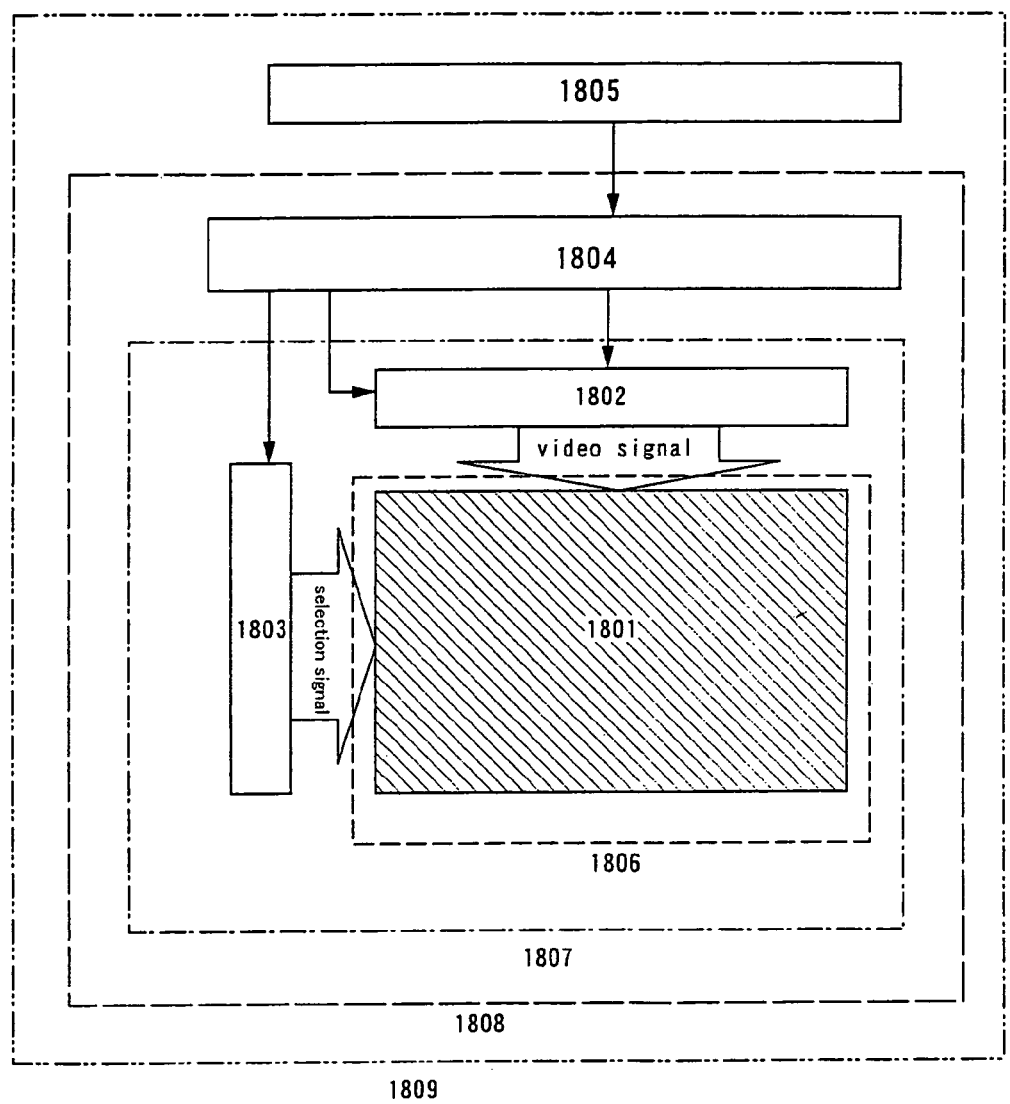
FIG. 18 is a diagram showing a display module after applying the inspection method of the present invention.

A case in which a connector such as an FPC or TAB is attached to a display panel of the present invention, forming an actual finished product which can be shipped, is explained in embodiment 6 using FIGS. 17A and 17B, and FIG. 18.

Reference numeral 1801 denotes a pixel portion which has passed the inspection method of the present invention, in which a plurality of pixels is formed. A module which has the pixel portion 1801, and a connector for connecting wirings of the pixel portion 1801 to the outside is referred to as a display panel 1806 in this specification.

Reference numeral 1802 denotes a source signal line driver circuit, and reference numeral 1803 denotes a gate signal line driver circuit. A video signal output from the source signal line driver circuit 1802 is input to specified pixels of the pixel portion 1801 in accordance with a selection signal output from the gate signal line driver circuit 1803. The video signal may be either digital or analog. Further, any number of source signal line driver circuits 1802 and gate signal line driver circuits 1803 may be formed.

A module which has a driver circuit composed of the source signal line driver circuit 1802 and the gate signal line driver circuit 1803, the pixel portion 1801, and a connector for connecting the wirings of the pixel portion 1801 and the wirings of the driver circuit to the outside is referred to as a display panel with an attached driver circuit 1807 in this specification. The display panel with an attached driver circuit 1807 is the display panel 1806 to which a driver circuit has been attached.

In the display panel with an attached driver circuit 1807, there are cases in which the driver circuit and the pixel portion 1801 are formed on separate substrates and then connected by a connector such as an FPC or TAB, and there are cases in which the driver circuit and the pixel portion 1801 are formed on the same substrate. The former is referred to as a display panel having an externally attached driver circuit, while the latter is referred to as a display panel with an integrated driver circuit.

FIG. 17A is a top surface diagram of a display panel with an externally attached driver circuit. The pixel portion 1801 is formed on a substrate 1810, and the wirings of the pixel portion 1801 are connected to the source signal line driver circuit 1802 and to the gate signal line driver circuit 1803 formed on an external substrate 1813 through an FPC 1811. The wirings of the source signal line driver circuit 1802, the gate signal line driver circuit 1803, and the pixel portion 1801 are connected to the outside by an external connection FPC 1812.

FIG. 17B is a top surface diagram of a display panel with an integrated driver circuit. The pixel portion 1801, the source signal line driver circuit 1802, and the gate signal line driver circuit 1803 are formed on the substrate 1810. The wirings of the pixel portion 1801, the source signal line driver circuit 1802, and the gate signal line driver circuit 1803 are connected to the outside through an external connection FPC 1812.

In FIG. 18, reference numeral 1804 denotes a controller, and the controller functions in order to drive the driver circuit and to display an image in the pixel portion 1801. For example, the controller inputs a signal with image information from the outside to the source signal line driver circuit 1802, generates signals for driving the driver circuit (for example, a clock signal CLK and a start pulse SP), and functions as an electric power source in order to supply electric potential to the driver circuit and to the pixel portion 1801.

A module which has the driver circuit, the pixel portion 1801, the controller 1804, and a connector for connecting the wirings of the pixel portion 1801, the driver circuit, and the controller to the outside is referred to as a display panel with an attached controller and driver circuit 1808 in this specification. The display panel with an attached controller and driver circuit is the display panel 1806 to which a driver circuit and a controller are attached.

Reference numeral 1805 denotes a microcomputer, which controls the driving of the controller. A module which has the microcomputer 1805, the driver circuit, the pixel portion 1801, the controller 1804, and the connector for connecting the wirings of the pixel portion 1801, the driver circuit, and the controller to the outside is referred to as a display panel with an attached microcomputer, controller, and driver circuit 1809 in this specification. The display panel with an attached microcomputer, controller, and driver circuit 1809 is the display panel 1806 to which a driver circuit, a controller, and a microcomputer are attached.

Note that, in practice, finished products are shipped as the display panel 1806, the display panel with an attached driver circuit 1807, the display panel with an attached controller and driver circuit 1808, or the display panel with an attached microcomputer, controller, and driver circuit 1809. The display panel 1806, the display panel with an attached driver circuit 1807, the display panel with an attached controller and driver circuit 1808, and the display panel with an attached microcomputer, controller, and driver circuit 1809 are all referred to as display modules in this specification.

Embodiment 7

A detailed structure of a pixel portion with an EL element which differs from the structure shown in Embodiment 3 and Embodiment 4 is explained in Embodiment 7.

Figure 19A:
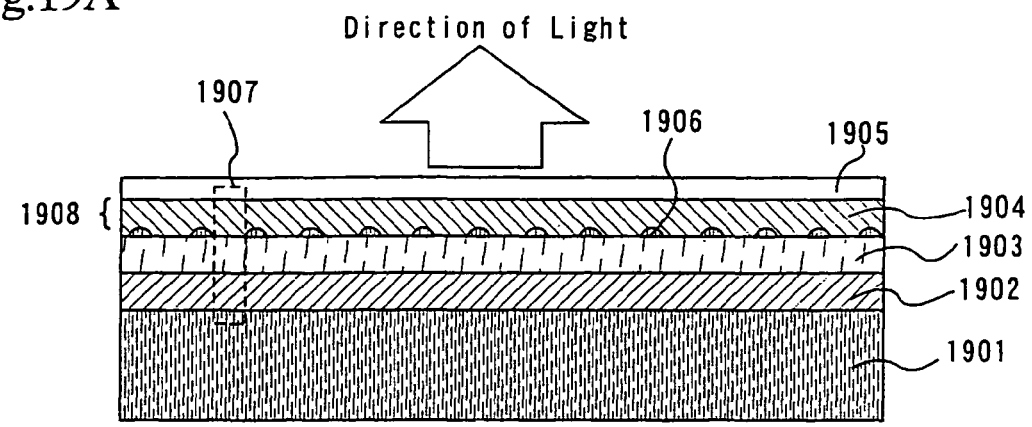
FIGS. 19A and 19B are cross sectional diagrams of an EL element.

FIG. 19A is a cross sectional diagram of an EL element 1907, and reference numeral 1901 denotes a light shielding film made from an interlayer insulating film in which a pigment is added to a resin to add a function as the light shielding film. An anode 1902 is formed on the light shielding film 1901, and an EL layer 1903 is formed on the anode 1902.

Clusters 1906 are formed on the EL layer 1903, and a transparent electrode 1904 is formed on the EL layer 1903 covering the clusters 1906. A protecting film 1905, which is effective in preventing oxygen and moisture from penetrating, is formed on the transparent electrode 1904.

The clusters 1906 are an aggregate of elements which belong to in group 1 or group 2 of the periodic table, and the clusters are formed as discreet points or as a single mass. In the structure of FIG. 19A, the work coefficient of the clusters 1906 determines a barrier to electron injection, and electrons are injected to the EL layer 1903 through the clusters 1906.

The clusters 1906 are formed as dots on the EL layer 1903, and therefore light emitted from the EL layer 1903 can be transmitted from the gaps between the clusters 1906.

It is preferable that the clusters 1906 have a diameter or major axis size of 10 to 100 nm, and a height of 5 to 10 nm, and the clusters themselves are translucent at this size. The clusters 1906 of this type can be formed by film deposition using evaporation, with a thin film thickness from 5 to 10 nm as a target.

Figure 19B:
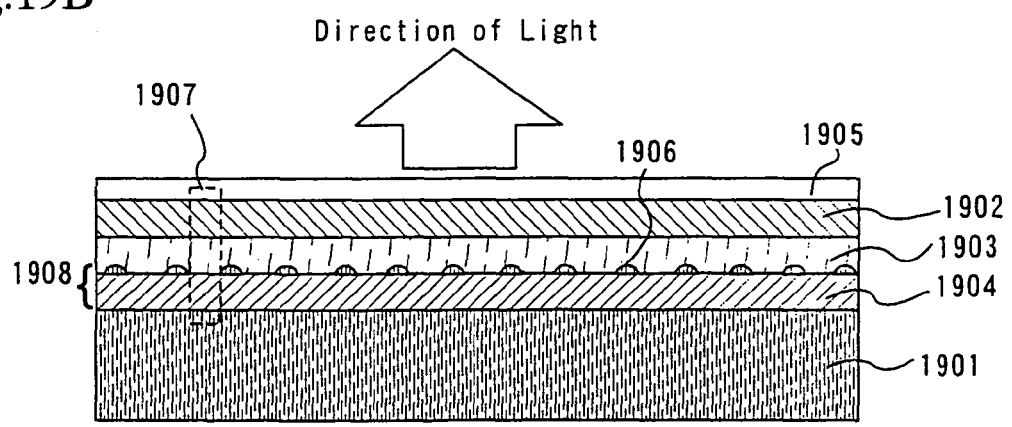

FIG. 19B is an example of forming the clusters 1906 of FIG. 19A on the transparent electrode 1904, not on the EL layer 1903.

In FIG. 19B, the transparent electrode 1904 is formed-on the light shielding film 1901, which functions as a light shielding film by adding of a pigment to a resin interlayer insulating film.

The clusters 1906 are formed on the transparent electrode 1904, and the EL layer 1903 is formed on the transparent electrode 1904, covering the clusters 1906.

The anode 1902 is formed on the EL layer 1903. A transparent material is used in FIG. 19B for the anode 1902. The protecting film 1905, which is effective in preventing oxygen and moisture from penetrating, is formed on the anode 1902.

The clusters 1906 are aggregates of elements which belong in group 1 or group 2 of the periodic table, and the clusters are formed as discreet points or as a single mass. It is possible to use the same materials shown in FIG. 19A for the clusters 1906. With the structure of FIG. 19B, the work coefficient of the clusters 1906 determines a barrier to electron injection, and electrons are injected to the EL layer 1903 through the clusters 1906.

Embodiment 8

An EL display device formed by implementing inspection method of the present invention has superior visibility in bright locations in comparison to a liquid crystal display device because it is a self-emission type device, and moreover its field of vision is wide. Accordingly, it can be used as a display portion for various electronic devices. For example, it is appropriate to use the EL display device formed by implementing the inspection method of the present invention as a display portion of an EL display having a diagonal equal to 30 inches or greater (typically equal to 40 inches or greater) for appreciation of TV broadcasts by large screen.

Note that all displays exhibiting (displaying) information such as a personal computer display, a TV broadcast reception display, or an advertisement display are included as the EL display. Further, the inspection method of the present invention can be used as a display portion of the other various electronic devices.

The following can be given as examples of such electronic devices of the present invention: a video camera; a digital camera; a goggle type display (head mounted display); a car navigation system; an audio reproducing device (such as a car audio system, an audio compo system); a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the field of vision is regarded as very important. Thus, it is preferable that the EL display device is employed. Examples of these electronic devices are shown in FIGS. 20 and 21.

Figure 20A:
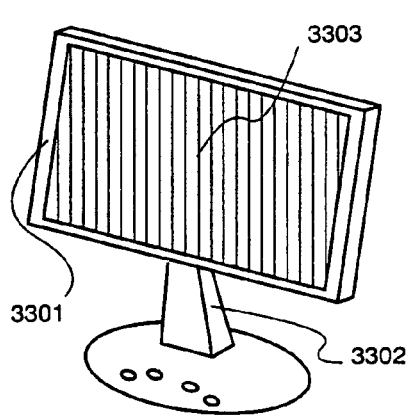
FIGS. 20A to 20F are electronic devices using an EL display after applying the inspection method of the present invention.

FIG. 20A is an EL display, containing a casing 3301, a support stand 3302, and a display portion 3303. The EL device which is applied the inspection method of the present invention can be used in the display portion 3303. Since the EL display is a self-emission type device with no need of a back light, its display portion can be made thinner than a liquid crystal display device.

Figure 20B:
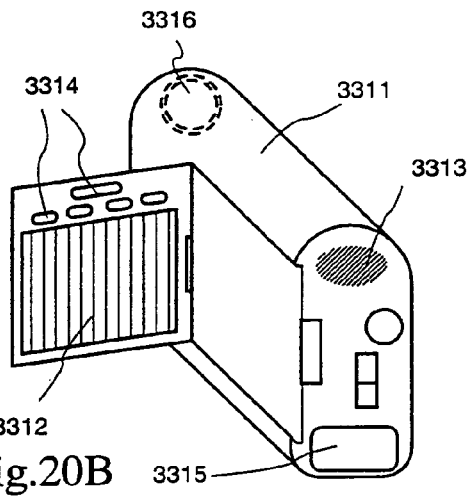

FIG. 20B is a video camera, containing a main body 3311, a display portion 3312, an audio input portion 3313, operation switches 3314, a battery 3315, and an image receiving portion 3316. The EL display device which is applied to the inspection method of the present invention can be used in the display portion 3312.

Figure 20C:
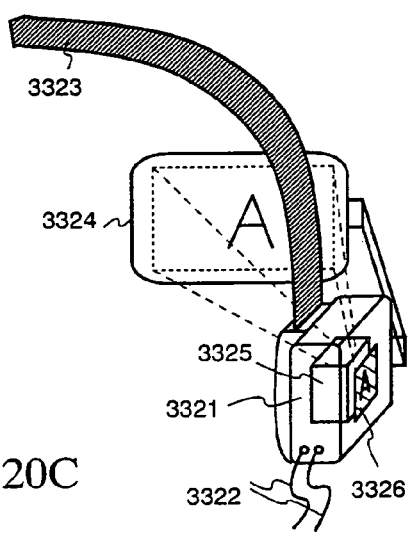

FIG. 20C is a portion of a head mounted type EL display device (right side), containing a main body 3321, a signal cable 3322, a head fixing band 3323, a screen portion 3324, an optical system 3325, and a display portion 3326. The EL display device which is applied the inspection method of the present invention can be used in the display portion 3326.

Figure 20D:
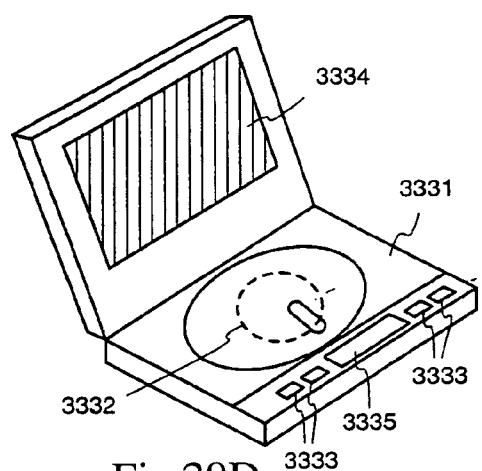

FIG. 20D is an image playback device (specifically, a DVD playback device) provided with a recording medium, containing a main body 3331, a recording medium (such as a DVD) 3332, operation switches 3333, a display portion (a) 3334, and a display portion (b) 3335. The display portion (a) 3334 is mainly used for displaying image information, and the display portion (b) 3335 is mainly used for displaying character information, and the EL display device which is applied to the inspection method of the present invention can be used in the display portion (a) 3334 and in the display portion (b) 3335. Note that domestic game equipment is included as the image playback device provided with a recording medium.

Figure 20E:
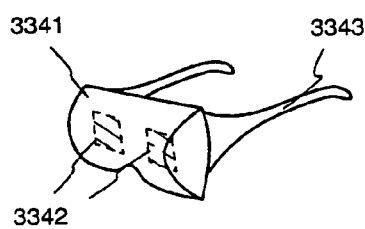

FIG. 20E is a goggle type display device (head mounted display), containing a main body 3341, a display portion 3342, and arm portion 3343. The EL display device which is applied the inspection method of the present invention can be used in the display portion 3342.

Figure 20F:
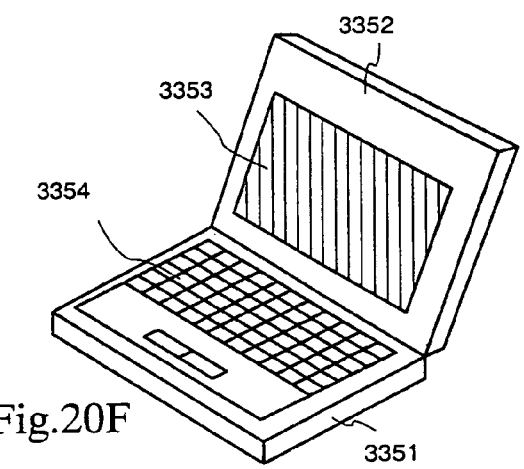

FIG. 20F is a personal computer, containing a main body 3351, a casing 3352, a display portion 3353, and a keyboard 3354. The EL display device which is applied the inspection method of the present invention can be used in the display portion 3353.

Note that if the emission luminance of EL materials becomes higher in the future, it will be possible to use the EL display device of the present invention in a front type or a rear type projector by projecting light including output images, which can be enlarged by lenses or the like.

The above electronic devices are becoming more often used to display information provided through an electronic telecommunication line such as the Internet or CATV (cable television), and in particular, opportunities for displaying animation information are increasing. The response speed of EL materials is extremely high, and therefore the EL display device is favorable for performing animation display.

Since the light emitting portion of the EL display device consumes power, it is preferable to display information so as to have the emitting portion become as small as possible. Therefore, when using the EL display device in a display portion which mainly displays character information, such as a portable information terminal, in particular, a portable telephone and an audio reproducing device, it is preferable to drive it by setting non-emitting portions as background and forming character information in emitting portions.

Figures 21A, 21B, 21C:
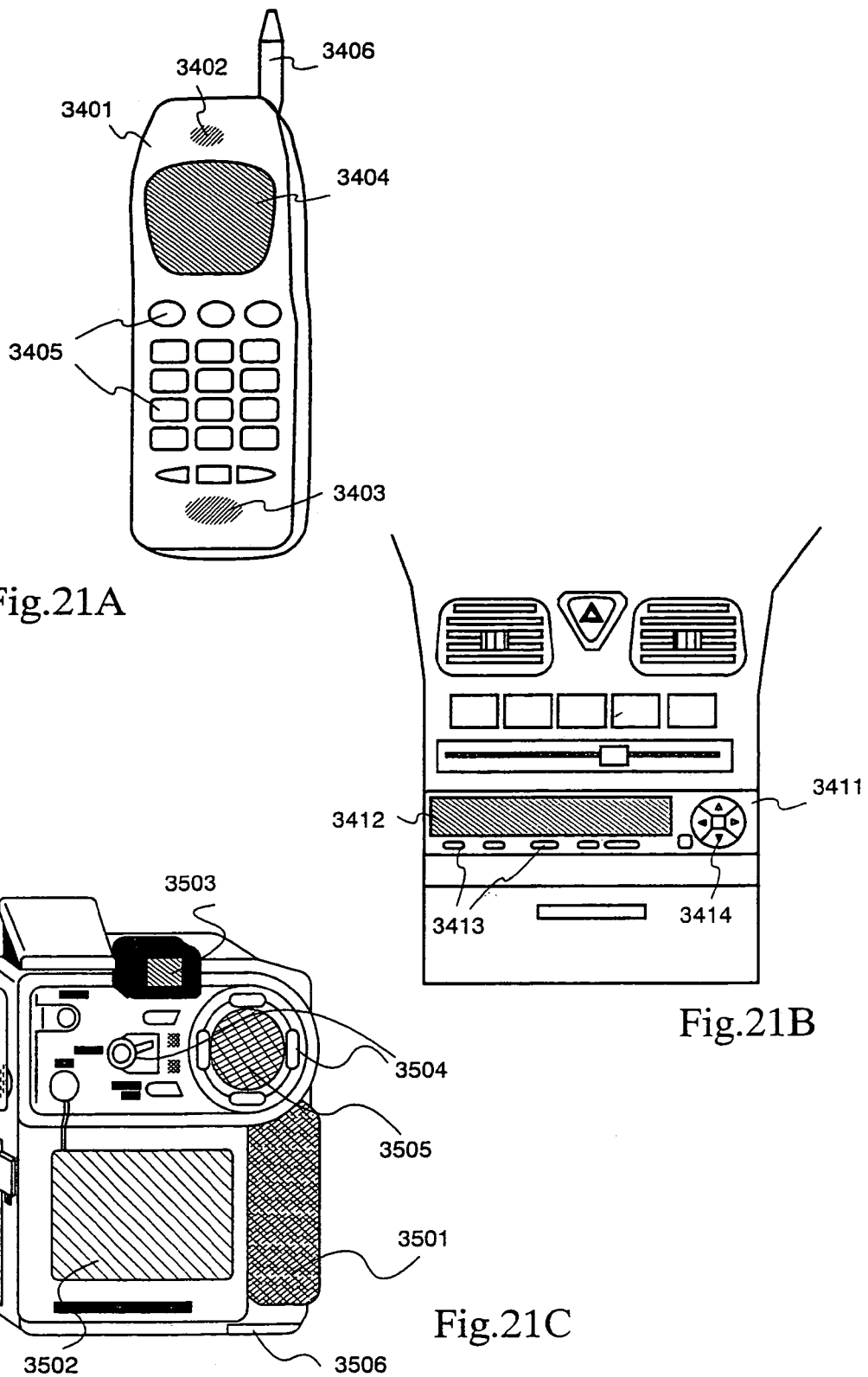
FIGS. 21A to 21C are electronic devices using an EL display after applying the inspection method of the present invention.

FIG. 21A is a portable telephone, containing a main body 3401, an audio output portion 3402, an audio input portion 3403, a display portion 3404, operation switches 3405, and an antenna 3406. The EL display device which is applied the inspection method of the present invention can be used in the display portion 3404. Note that by displaying white characters in a black background in the display portion 3404, the power consumption of the portable telephone can be reduced.

FIG. 21B is an audio reproducing device, specifically a car audio system, containing a main body 3411, a display portion 3412, and operation switches 3413 and 3414. The EL display device which is applied the inspection method of the present invention can be used in the display portion 3412. Furthermore, an audio reproducing device for a car is shown in Embodiment 8, but it may also be used for a portable type and a domestic type of audio reproducing device. Note that by displaying white characters in a black background in the display portion 3412, the power consumption can be reduced. This is particularly effective in a portable type audio reproducing device.

FIG. 21C is a digital camera, containing a main body 3501, a display portion A 3502, an eye piece portion 3503, an operation switch 3504, a display portion B 3505 and a battery 3506. The EL display device which is applied the inspection method of the present invention can be used in the display portion A 3502 and the display portion B 3505. Note that in the case of using mainly the display portion B 3505 as an operation panel, by displaying white characters in a black background, the power consumption of the digital camera can be reduced.

In the case of the portable electric device shown in this embodiment, the sensor portion is provided to perceive the external light and the function to lower the brightness of display when it is used in the dark area as a method to lower the power consumption.

The range of applications of the present invention is thus extremely wide, and it is possible to apply the present invention to electronic devices in all fields. Furthermore, Embodiment 8 can be implemented in combination of any structures of the embodiments 1 to 7.

In accordance with the inspection methods of the present invention, it becomes possible to distinguish between good and defective EL panels without completing the EL panels into EL displays. It therefore becomes unnecessary to complete defective EL panels, which will not actually become finished products, into EL displays. The processes for forming the EL elements, packaging (sealing), and attaching a connector can consequently be omitted, and the time and cost can be reduced. Furthermore, the processes for packaging and for attaching a connector can also be omitted in cases in which the EL panels are formed using a multi-faceted substrate, and the time and cost can similarly be reduced.

With the first inspection method, pixel electrodes can be formed by patterning the conductive film used during inspection after the inspection is finished. It is therefore unnecessary to increase the number of the processes for the inspection.

Note that it is possible to distinguish between good products and defective products for all types of EL displays containing pixels with various structures, in accordance with the method of inspection of the present invention.

What is claimed is:

1. A method of inspecting a display panel in a manufacturing process of said display panel comprising a plurality of pixels each comprising a thin film transistor and a pixel electrode electrically connected to said thin film transistor, said method comprising steps of:
    making said thin film transistor in an on state before forming said pixel electrode by patterning a conductive film;
    measuring a value of electric current flowing in said conductive film; and
    judging whether or not said thin film transistor is defective from said value,
    wherein said steps are performed to all of said plurality of pixels in order.

2. A method of inspecting a display panel in a manufacturing process of said display panel comprising a plurality of pixels each comprising a wiring, a thin film transistor, and a pixel electrode, said method comprising steps of:
    making said thin film transistor in an on state by controlling an electric potential of said wiring before forming said pixel electrode by patterning a conductive film;
    measuring a value of electric current flowing in said conductive film; and
    judging whether or not said thin film transistor and said wiring are defective from said value,
    wherein said steps are performed to all of said plurality of pixels in order.

3. A method of inspecting a display panel in a manufacturing process of said display panel comprising a plurality of pixels each comprising a switching thin film transistor, an EL driver thin film transistor, a source signal line, a gate signal line, a power source supply line, and a pixel electrode electrically connected to said EL driver thin film transistor, said method comprising steps of:
    making said switching thin film transistor in an on state by controlling an electric potential of said gate signal line, making said EL driver thin film transistor in an on state by controlling an electric potential of said source signal line, and controlling an electric potential of said power source supply line, before forming said pixel electrode by patterning a conductive film;

measuring a value of electric current flowing in said conductive film; and judging whether or not said switching thin film transistor, said EL driver thin film transistor, said source signal line, said gate signal line, said power source supply line are defective from said value, wherein said steps are performed to all of said plurality of pixels in order.

4. A method of inspecting a display panel in a manufacturing process of said display panel comprising a plurality of pixels each comprising a switching thin film transistor, an EL driver thin film transistor, a source signal line, a gate signal line, a power source supply line, and a pixel electrode connected to a drain region of said EL driver thin film transistor, said method comprising steps of:

making said switching thin film transistor in an on state by controlling an electric potential of said gate signal line, making said EL driver thin film transistor in an on state by controlling an electric potential of said source signal line, and controlling an electric potential of said power source supply line, before forming said pixel electrode by patterning a conductive film;

measuring a value of electric current flowing in said conductive film; and judging whether or not said switching thin film transistor, said EL driver thin film transistor, said source signal line, said gate signal line, said power source supply line are defective from said value, wherein said steps are performed to all of said plurality of pixels in order.

5. A method of inspecting a display panel in a manufacturing process of said display panel comprising a plurality of pixels each comprising a first switching thin film transistor, a second switching thin film transistor, an EL driver thin film transistor, a source signal line, a first gate signal line, a second gate signal line, a power source supply line, and a pixel electrode electrically connected to said EL driver thin film transistor, said method comprising steps of:

making said first switching thin film transistor in an on state by controlling an electric potential of said first gate signal line, making said EL driver thin film transistor in an on state by controlling an electric potential of said source signal line, and controlling an electric potential of said power source supply line, before forming said pixel electrode by patterning a conductive film;

measuring a first value of electric current flowing in said conductive film;

making said second switching thin film transistor in an on state by controlling an electric potential of said second gate signal, line and making said EL driver thin film transistor in an off state, before forming said pixel electrode by patterning the conductive film;

measuring a second value of electric current flowing in said conductive film;

judging whether or not said first switching thin film transistor, said second switching thin film transistor, said EL driver thin film transistor, said source signal line, said first gate signal line, said second gate signal line, and said power source supply line are defective from said first value and said second value, wherein said steps are performed to all of said plurality of pixels in order.

6. A method of inspecting a display panel in a manufacturing process of said display panel comprising a plurality of pixels each comprising a first switching thin film transistor, a second switching thin film transistor, an EL driver thin film transistor, a source signal line, a first gate signal line, a second gate signal line, a power source supply line, and a pixel electrode connected to a drain region said EL driver thin film transistor, said method comprising steps of:

making said first switching thin film transistor in an on state by controlling an electric potential of said first gate signal line, making said EL driver thin film transistor in an on state by controlling an electric potential of said source signal line, and controlling an electric potential of said power source supply line, before forming said pixel electrode by patterning a conductive film;

measuring a first value of electric current flowing in said conductive film;

making said second switching thin film transistor in an on state by controlling an electric potential of said second gate signal line and making said EL driver thin film transistor in an off state, before forming said pixel electrode by patterning the conductive film;

measuring a second value of electric current flowing in said conductive film;

judging whether or not said first switching thin film transistor, said second switching thin film transistor, said EL driver thin film transistor, said source signal line, said first gate signal line, said second gate signal line, and said power source supply line are defective from said first value and said second value, wherein said steps are performed to all of said plurality of pixels in order.

7. A method according to claim 1, wherein an EL layer and an opposing electrode are laminated in order on said pixel electrode after said pixel electrode is formed.

8. A method according to claim 2, wherein an EL layer and an opposing electrode are laminated in order on said pixel electrode after said pixel electrode is formed.

9. A method according to claim 3, wherein an EL layer and an opposing electrode are laminated in order on said pixel electrode after said pixel electrode is formed.

10. A method according to claim 4, wherein an EL layer and an opposing electrode are laminated in order on said pixel electrode after said pixel electrode is formed.

11. A method according to claim 5, wherein an EL layer and an opposing electrode are laminated in order on said pixel electrode after said pixel electrode is formed.

12. A method according to claim 6, wherein an EL layer and an opposing electrode are laminated in order on said pixel electrode after said pixel electrode is formed.

13. A method according to claim 1, wherein said value of electric current flowing in said conductive film is obtained by measuring a value of electric current flowing in a measurement wiring connected to said conductive film.

14. A method according to claim 2, wherein said value of electric current flowing in said conductive film is obtained by measuring a value of electric current flowing in a measurement wiring connected to said conductive film.

15. A method according to claim 3, wherein said value of electric current flowing in said conductive film is obtained by measuring a value of electric current flowing in a measurement wiring connected to said conductive film.

16. A method according to claim 4, wherein said value of electric current flowing in said conductive film is obtained by measuring a value of electric current flowing in a measurement wiring connected to said conductive film.

17. A method according to claim 5, wherein said first value and said second value of electric current flowing in said conductive film are obtained by measuring values of electric current flowing in a measurement wiring connected to said conductive film, respectively.

18. A method according to claim 6, wherein said first value and said second value of electric current flowing in said conductive film are obtained by measuring values of electric current flowing in a measurement wiring connected to said conductive film, respectively.

19. A method of inspecting a display panel in a manufacturing process of said display panel comprising a plurality of pixels each comprising a thin film transistor and a pixel electrode electrically connected to said thin film transistor, said method comprising steps of:
   connecting all the pixel electrodes of said plurality of pixels electrically by an inspection conductive film;
   making said thin film transistor in an on state;
   measuring a value of electric current flowing in said inspection conductive film;
   judging whether or not said thin film transistor is defective from said value; and
   removing said inspection conductive film after said judging is performed to all of said plurality of pixels in order.

20. A method of inspecting a display panel in a manufacturing process of said display panel comprising a plurality of pixels each comprising a wiring, a thin film transistor and a pixel electrode electrically connected to said thin film transistor, said method comprising steps of:
   connecting all the pixel electrodes of said plurality of pixels electrically by an inspection conductive film;
   making said thin film transistor in an on state by controlling an electric potential of said wiring;
   measuring a value of electric current flowing in said inspection conductive film;
   judging whether or not said wiring and said thin film transistor is defective from said value; and
   removing said inspection conductive film after said judging is performed to all of said plurality of pixels in order.

21. A method of inspecting a display panel in a manufacturing process of said display panel comprising a plurality of pixels each comprising a switching thin film transistor, an EL driver thin film transistor, a source signal line, a gate signal line, a power source supply line, and a pixel electrode electrically connected to said EL driver thin film transistor, said method comprising steps of:
   connecting all the pixel electrodes of said plurality of pixels electrically by an inspection conductive film;
   making said switching thin film transistor in an on state by controlling an electric potential of said gate signal line, making said EL driver thin film transistor in an on state by controlling an electric potential of said source signal line, and controlling an electric potential of said power source supply line;
   measuring a value of electric current flowing in said inspection conductive film;
   judging whether or not said switching thin film transistor, said EL driver thin film transistor, said source signal line, said gate signal line, said power source supply line are defective from said value; and
   removing said inspection conductive film after said judging is performed to all of said plurality of pixels in order.

22. A method of inspecting a display panel in a manufacturing process of said display panel comprising a plurality of pixels each comprising a switching thin film transistor, an EL driver thin film transistor, a source signal line, a gate signal line, a power source supply line, and a pixel electrode connected to a drain region of said EL driver thin film transistor, said method comprising steps of:
   connecting all the pixel electrodes of said plurality of pixels electrically by an inspection conductive film;
   making said switching thin film transistor in an on state by controlling an electric potential of said gate signal line, making said EL driver thin film transistor in an on state by controlling an electric potential of said source signal line, and controlling an electric potential of said power source supply line;
   measuring a value of electric current flowing in said inspection conductive film;
   judging whether or not said switching thin film transistor, said EL driver thin film transistor, said source signal line, said gate signal line, said power source supply line are defective from said value; and
   removing said inspection conductive film after said judging is performed to all of said plurality of pixels in order.

23. A method of inspecting a display panel in a manufacturing process of said display panel comprising a plurality of pixels each comprising a first switching thin film transistor, a second switching thin film transistor, an EL driver thin film transistor, a source signal line, a first gate signal line, a second gate signal line, a power source supply line, and a pixel electrode electrically connected to said EL driver thin film transistor, said method comprising steps of:
   connecting all the pixel electrodes of said plurality of pixels electrically by an inspection conductive film;
   making said first switching thin film transistor in an on state by controlling an electric potential of said first gate signal line, making said EL driver thin film transistor in an on state by controlling an electric potential of said source signal line, and controlling an electric potential of said power source supply line;
   measuring a first value of electric current flowing in said inspection conductive film;
   making said second switching thin film transistor in an on state by controlling an electric potential of said second gate signal line and making said EL driver thin film transistor in an off state;
   measuring a second value of electric current flowing in said inspection conductive film;
   judging whether or not said first switching thin film transistor, said second switching thin film transistor, said EL driver thin film transistor, said source signal line, said first gate signal line, said second gate signal line, and said power source supply line are defective from said first value and said second value,
   removing said inspection conductive film after said judging is performed to all of said plurality of pixels in order.

24. A method of inspecting a display panel in a manufacturing process of said display panel comprising a plurality of pixels each comprising a first switching thin film transistor, a second switching thin film transistor, an EL driver thin film transistor, a source signal line, a first gate signal line, a second gate signal line, a power source supply line, and a pixel electrode connected to a drain region of said EL driver thin film transistor, said method comprising steps of:
   connecting all the pixel electrodes of said plurality of pixels electrically by an inspection conductive film;
   making said first switching thin film transistor in an on state by controlling an electric potential of said first gate signal line, making said EL driver thin film transistor in an on state by controlling an electric potential of said source signal line, and controlling an electric potential of said power source supply line;
   measuring a first value of electric current flowing in said inspection conductive film;

making said second switching thin film transistor in an on state by controlling an electric potential of said second gate signal line and making said EL driver thin film transistor in an off state;

measuring a second value of electric current flowing in said inspection conductive film;

judging whether or not said first switching thin film transistor, said second switching thin film transistor, said EL driver thin film transistor, said source signal line, said first gate signal line, said second gate signal line, and said power source supply line are defective from said first value and said second value, removing said inspection conductive film after said judging is performed to all of said plurality of pixels in order.

25. A method according to claim 19, wherein an EL layer and an opposing electrode are laminated in order on said pixel electrode after said inspection conductive film is removed.

26. A method according to claim 20, wherein an EL layer and an opposing electrode are laminated in order on said pixel electrode after said inspection conductive film is removed.

27. A method according to claim 21, wherein an EL layer and an opposing electrode are laminated in order on said pixel electrode after said inspection conductive film is removed.

28. A method according to claim 22, wherein an EL layer and an opposing electrode are laminated in order on said pixel electrode after said inspection conductive film is removed.

29. A method according to claim 23, wherein an EL layer and an opposing electrode are laminated in order on said pixel electrode after said inspection conductive film is removed.

30. A method according to claim 24, wherein an EL layer and an opposing electrode are laminated in order on said pixel electrode after said inspection conductive film is removed.

31. A method according to claim 19, wherein said value of electric current flowing in said inspection conductive film is obtained by measuring a value of electric current flowing in a measurement wiring connected to said inspection conductive film.

32. A method according to claim 20, wherein said value of electric current flowing in said inspection conductive film is obtained by measuring a value of electric current flowing in a measurement wiring connected to said inspection conductive film.

33. A method according to claim 21, wherein said value of electric current flowing in said inspection conductive film is obtained by measuring a value of electric current flowing in a measurement wiring connected to said inspection conductive film.

34. A method according to claim 22, wherein said value of electric current flowing in said inspection conductive film is obtained by measuring a value of electric current flowing in a measurement wiring connected to said inspection conductive film.

35. A method according to claim 23, wherein said first value and said second value of electric current flowing in said inspection conductive film are obtained by measuring values of electric current flowing in a measurement wiring connected to said inspection conductive film, respectively.

36. A method according to claim 24, wherein said first value said second value of electric current flowing in said inspection conductive film are obtained by measuring values of electric current flowing in a measurement wiring connected to said inspection conductive film, respectively.

37. A method according to claim 19, wherein said inspection conductive film is a fluid.

38. A method according to claim 20, wherein said inspection conductive film is a fluid.

39. A method according to claim 21, wherein said inspection conductive film is a fluid.

40. A method according to claim 22, wherein said inspection conductive film is a fluid.

41. A method according to claim 23, wherein said inspection conductive film is a fluid.

42. A method according to claim 24, wherein said inspection conductive film is a fluid.

\* \* \* \* \*

UNITED STATES PATENT AND TRADEMARK OFFICE
CERTIFICATE OF CORRECTION

PATENT NO.       : 7,741,132 B2
APPLICATION NO.  : 11/518229
DATED            : June 22, 2010
INVENTOR(S)      : Shunpei Yamazaki et al.

It is certified that error appears in the above-identified patent and that said Letters Patent is hereby corrected as shown below:

At column 24, line 60, please change "inlerlayer" to --interlayer--;

At column 33, line 50, claim 5 please change "gate signal, line" to --gate signal line--.

Signed and Sealed this

Sixteenth Day of November, 2010

David J. Kappos
*Director of the United States Patent and Trademark Office*